（12）United States Patent
Kawahito et al.

(10) Patent No.: US 11,678,077 B2
(45) Date of Patent: Jun. 13, 2023

(54) IMAGING DEVICE

(71) Applicants: NATIONAL UNIVERSITY CORPORATION SHIZUOKA UNIVERSITY, Shizuoka (JP); NATIONAL UNIVERSITY CORPORATION GUNMA UNIVERSITY, Maebashi (JP)

(72) Inventors: Shoji Kawahito, Hamamatsu (JP); Hiromasa Oku, Maebashi (JP)

(73) Assignees: National University Corporation Shizuoka University; National University Corporation Gunma University ( * ) Notice: Subject to any disclaimer, the term of this patent is extended or adjusted under 35 U.S.C. 154(b) by 0 days.

(21) Appl. No.: 17/779,160

(22) PCT Filed: Nov. 25, 2020

(86) PCT No.: PCT/JP2020/043885
§ 371 (c)(1),
(2) Date: May 24, 2022

(87) PCT Pub. No.: WO2021/106953
PCT Pub. Date: Jun. 3, 2021

(65) Prior Publication Data
US 2022/0417455 A1    Dec. 29, 2022

(30) Foreign Application Priority Data
Nov. 26, 2019   (JP) .............................. JP2019-213044

(51) Int. Cl.
H04N 25/50    (2023.01)
H04N 25/77    (2023.01)
(Continued)

(52) U.S. Cl.
CPC ............... *H04N 25/50* (2023.01); *G02B 7/28* (2013.01); *H04N 25/77* (2023.01)

(58) Field of Classification Search
CPC ........ H04N 25/50; H04N 25/77; H04N 23/55; H04N 25/53; G02B 7/28
See application file for complete search history.

(56) References Cited

U.S. PATENT DOCUMENTS 5,237,362 A * 8/1993 Ishino ...................... G02B 4/10
396/9
9,432,567 B2 * 8/2016 Yamasaki .............. H04N 25/67
(Continued)

FOREIGN PATENT DOCUMENTS

JP    2015-095874 A    5/2015
JP    2018-050267 A    3/2018
(Continued)

OTHER PUBLICATIONS

International Search Report dated Feb. 16, 2021 in corresponding International Application No. PCT/JP2020/043885.
(Continued)

Primary Examiner — Marly S Camargo
(74) Attorney, Agent, or Firm — Ostrolenk Faber LLP

(57) ABSTRACT

An imaging device includes a varifocal lens and an imaging sensor which outputs a signal corresponding to light. The imaging sensor includes a photoelectric conversion unit which converts light into an electric charge, electric charge reading regions, transfer control electrodes, a gate control circuit which sequentially applies control signals to the transfer control electrodes to correspond to the position of the focal point of the varifocal lens, and a reading circuit which outputs a signal corresponding to the amount of the electric charge transferred to the electric charge reading regions. The gate control circuit repeats an operation of outputting each of the control signals when the position of
(Continued)

the focal point is located in the focal ranges during a frame period.

12 Claims, 20 Drawing Sheets

(51) Int. Cl.
    *G02B 7/28*     (2021.01)
    *H04N 13/236*     (2018.01)

(56) References Cited

U.S. PATENT DOCUMENTS

| | | | | |
|---|---|---|---|---|
| 2013/0321927 A1 | 12/2013 | Arnold et al. | ................ | 359/652 |
| 2019/0331873 A1* | 10/2019 | Cook | ....................... | G02B 7/04 |
| 2021/0080688 A1* | 3/2021 | Landig | .................. | G03B 13/36 |

FOREIGN PATENT DOCUMENTS

| | | |
|---|---|---|
| JP | 2018-084821 A | 5/2018 |
| JP | 2019-191180 A | 10/2019 |

OTHER PUBLICATIONS

English translation of the International Preliminary Report on Patentability (IPRP) (Chapter 1) dated May 27, 2022 with a Notification from the International Bureau (Form PCT/IB/338) in corresponding International Application No. PCT/JP2020/043885.

* cited by examiner

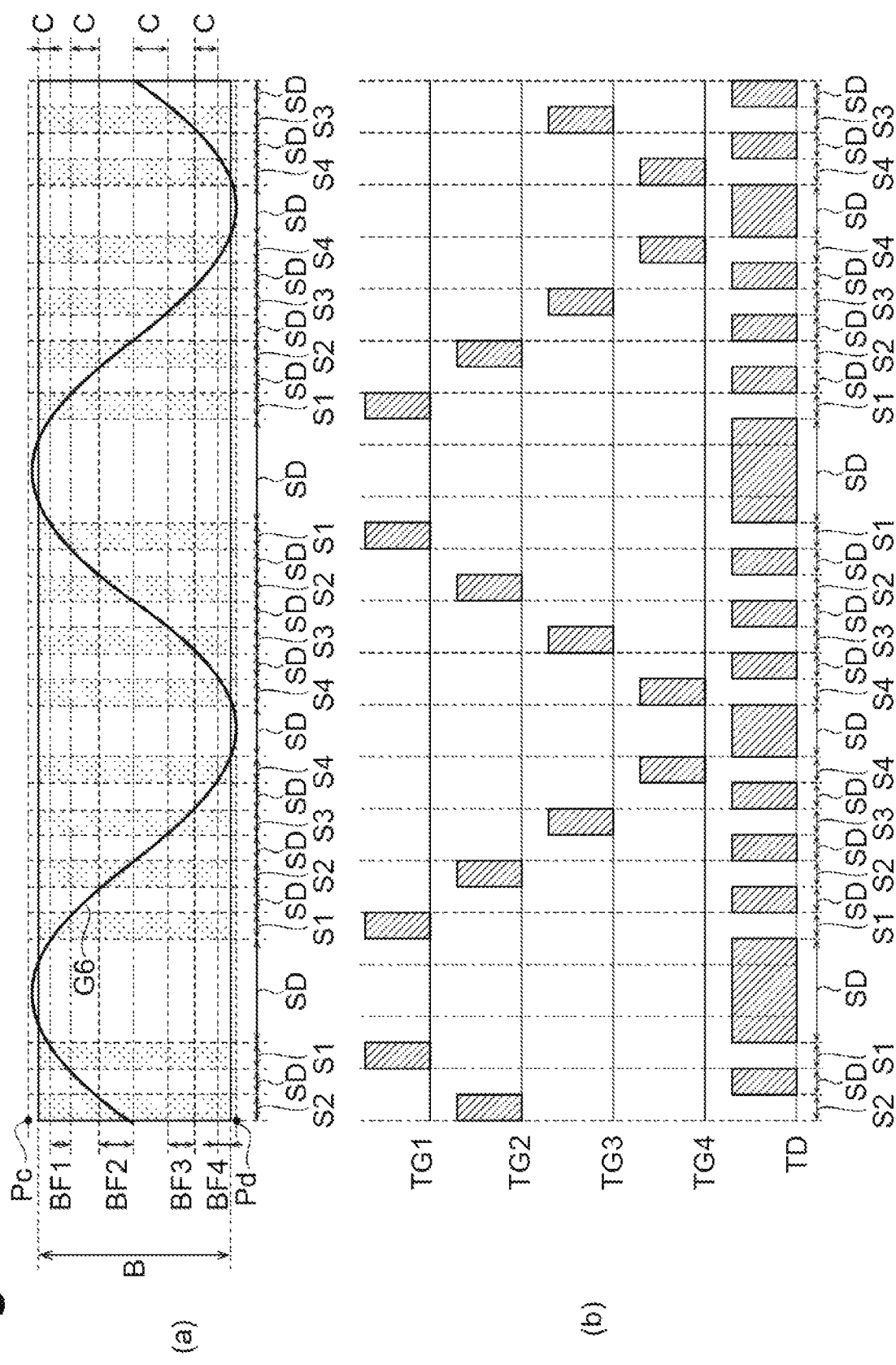

IMAGING DEVICE

CROSS-REFERENCE TO RELATED APPLICATION

The present application is a 35 U.S.C. § 371 national stage application of International Application No. PCT/JP2020/043885, filed Nov. 25, 2020, which claims priority to Japanese Patent Application JP 2019-213044, filed Nov. 26, 2019, the disclosure of which applications is incorporated herein by reference. The PCT International Application was published in the Japanese language.

TECHNICAL FIELD

The present invention relates to an imaging device.

BACKGROUND ART

In general, a focal length of a lens is a value unique to each lens. On the other hand, a so-called varifocal lens that can change the focal length is known. For example, Patent Literature 1 discloses a technique for the varifocal lens. The varifocal lens of Patent Literature 1 uses a liquid as an element for refracting light. Then, when the liquid is resonantly vibrated, a density distribution is generated. As a result, the focal length of the varifocal lens fluctuates at a speed determined by the frequency of vibration. The frequency of vibration is, for example, in the range of several tens of Hz to several hundreds of kHz.

CITATION LIST

Patent Literature

Patent Literature 1: U.S. Patent Application Publication No. 2013/0321927

SUMMARY OF INVENTION

Technical Problem

An imaging device using a varifocal lens and the image sensor is being studied. The varifocal lens that uses a liquid changes a focal distance by resonant vibration. Thus, the focal distance of the varifocal lens always changes. When an imaging range is set to be included in the range in which the position of the focal point fluctuates, an exposure is performed only during a period in which the focal point exists in the imaging range. However, since the period in which the focal point exists in the imaging range is extremely short, an exposure period also becomes short. When the exposure period is short, the amount of light incident on the image sensor is not sufficient. That is, the brightness of the obtained image becomes low.

Here, the present invention provides an imaging device capable of increasing the brightness of an obtained image.

Solution to Problem

An imaging device according to one embodiment of the present invention includes a varifocal lens in which a position of a focal point periodically changes between a farthest point and a closest point during a frame period and a pixel circuit unit which is disposed to overlap an optical axis of the varifocal lens and is configured to receive light having passed through the varifocal lens and output a signal corresponding to the light. The pixel circuit unit includes a photoelectric conversion unit which converts the light into an electric charge, an electric charge reading region which is provided adjacent to the photoelectric conversion unit, a transfer control electrode which is provided between the photoelectric conversion unit and the electric charge reading region and receives a transfer control signal for transferring an electric charge between the photoelectric conversion unit and the electric charge reading region, an electric charge discharging region which is provided to be adjacent to the photoelectric conversion unit and to be separated from the electric charge reading region and discharges the electric charge not provided for reading a signal corresponding to the light, a discharge control electrode which is provided between the photoelectric conversion unit and the electric charge discharging region and receives a discharge control signal for transferring an electric charge between the photoelectric conversion unit and the electric charge discharging region, a control means for applying the transfer control signal to the transfer control electrode and applying the discharge control signal to the discharge control electrode to correspond to the position of the focal point of the varifocal lens, and a signal reading means for outputting the signal corresponding to the amount of the electric charge transferred to the electric charge reading region. The control means repeats an operation of outputting the transfer control signal when the position of the focal point is located in a focal range set in an imaging range and an operation of outputting the discharge control signal when the position of the focal point is located in a non-imaging range not overlapping the imaging range during the frame period.

The imaging device includes the varifocal lens. In this varifocal lens, the position of the focal point periodically changes between the farthest point and the closest point during the frame period. Then, the electric charge transfer control means transfers the electric charge generated in the photoelectric conversion unit when the position of the focal point is located in the imaging range to the electric charge reading region. The electric charge transfer control means transfers the electric charge to the electric charge discharging region when the position of the focal point is in the non-imaging range. Further, the electric charge transfer control means repeats the transfer to the electric charge reading region and the transfer to the electric charge discharging region during the frame period. As a result, the electric charge obtained when the position of the focal point is located in the imaging range is accumulated in the electric charge reading region whenever such a transfer operation is repeated. That is, even when the amount of the electric charge transferred by one transfer operation is small, the amount of the electric charge accumulated in the electric charge reading region increases by repeating the transfer operation. Thus, it is possible to increase the brightness of the obtained image according to an increase in electric charge amount.

The pixel circuit unit of the imaging device of one embodiment may further include the pixel circuit unit further includes one or more additional electric charge reading regions provided to be adjacent to the photoelectric conversion unit and separated from the electric charge reading region and one or more additional transfer control electrodes which are provided between the photoelectric conversion unit and the additional electric charge reading region and receive an additional transfer control signal for transferring an electric charge between the photoelectric conversion unit and the additional electric charge reading region. The control means may further perform an operation of outputting the additional transfer control signal when the position of the focal point is located in an additional focal range set in the imaging range and not overlapping the focal range during the frame period. The signal reading means may further output a signal corresponding to an electric charge amount which is an amount of an electric charge transferred to the additional electric charge reading region. According to this configuration, it is possible to set a plurality of focal ranges in the imaging range. Thus, it is possible to obtain a clear and focused image.

The control means of the imaging device of one embodiment may generate the transfer control signal and the additional transfer control signal so that a length of a period of permitting the transfer of the electric charge from the photoelectric conversion unit to the electric charge reading region and a length of a period of permitting the transfer of the electric charge from the photoelectric conversion unit to the one or more additional electric charge reading regions are the same as each other. According to this configuration, the transfer operations are switched at a predetermined time interval. Thus, it is possible to simplify the control by the electric charge transfer control means.

The control means of the imaging device of one embodiment may generate the transfer control signal and the additional transfer control signal so that a change amount of the position of the focal point during a period of permitting the transfer of the electric charge from the photoelectric conversion unit to the electric charge reading region and a change amount of the position of the focal point during a period of permitting the transfer of the electric charge from the photoelectric conversion unit to the one or more additional electric charge reading regions are the same as each other. According to this configuration, it is possible to make the length of each focal range constant.

The control means of the imaging device of one embodiment may set a plurality of subframe periods included in the frame period. The control means may set an imaging range for each of the plurality of subframe periods. According to this configuration, it is possible to finely set a focal range included in the imaging range.

In one embodiment, the imaging range set for each of the plurality of subframe periods may not overlap each other. According to this configuration, it is possible to widen the imaging range.

In one embodiment, the imaging range set for each of the plurality of subframe periods may overlap each other. According to this configuration, it is possible to further finely set the focal range included in the imaging range.

The control means of the imaging device of one embodiment may perform an operation of outputting the transfer control signal twice for one cycle of the change of the position of the focal point. According to this configuration, the amount of the electric charge transferred to the electric charge reading means increases. Thus, it is possible to further increase the brightness of the obtained image.

The control means of the imaging device of one embodiment may perform an operation of outputting the transfer control signal once for one cycle of the change of the position of the focal point. According to this configuration, it is possible to liberalize the synchronization condition of the periodical movement of the position of the focal point of the varifocal lens and the transfer operation of the pixel circuit unit.

The varifocal lens of the imaging device of one embodiment may include a lens unit through which light is transmitted and a lens driving unit which periodically changes the position of the focal point of the lens unit by providing a lens driving signal to the lens unit. The imaging device may further include a pixel control unit which receives the lens driving signal from the lens driving unit and provides a control signal for the pixel circuit unit to the pixel circuit unit on the basis of the lens driving signal. According to this configuration, it is possible to synchronize the operation of the lens unit with the operation of the pixel circuit unit.

The electric charge reading region of the imaging device of one embodiment may have a two-stage transfer structure. The two-stage transfer structure may include an electric charge accumulation portion which receives the electric charge from the photoelectric conversion unit, a floating diffusion portion which receives the electric charge from the electric charge accumulation portion and is connected to the signal reading means, a reset drain which receives the electric charge from the floating diffusion portion, a transfer gate electrode which controls the transfer of the electric charge from the electric charge accumulation portion to the floating diffusion portion, and a reset gate electrode which controls the transfer of the electric charge from the floating diffusion portion to the reset drain. According to this configuration, it is possible to reduce noise caused by the reset operation of the floating diffusion portion.

The electric charge reading region of the imaging device of one embodiment may have a one-stage transfer structure. The electric charge reading region may have a one-stage transfer structure. The one-stage transfer structure may include a floating diffusion portion which receives the electric charge from the photoelectric conversion unit, a reset drain which receives the electric charge from the floating diffusion portion, and a reset gate electrode which controls the transfer of the electric charge from the floating diffusion portion to the reset drain. According to this configuration, it is possible to simplify the configuration of the electric charge reading region. That is, it is possible to simplify the configuration of the pixel circuit unit.

The control means of the imaging device of one embodiment may perform an operation of outputting the transfer control signal, performs an operation of outputting the discharge control signal after the operation of outputting the transfer control signal, performs an operation of outputting the additional transfer control signal after the operation of outputting the discharge control signal, and performs an operation of outputting the discharge control signal again after the operation of outputting the additional transfer control signal. According to this configuration, it is possible to discretely set each focal range to a narrow range. As a result, since the focal range in which the light from different focal points is averaged is narrowed, it is possible to increase the sharpness of the image of each focal range.

Advantageous Effects of Invention

According to the present invention, there is provided an imaging device capable of increasing the brightness of an obtained image.

BRIEF DESCRIPTION OF DRAWINGS

FIG. 20(a) is a graph showing a fluctuation in focal point of the imaging device of the eighth modified example and FIG. 20(b) is a timing chart showing an operation of the eighth modified example.

DESCRIPTION OF EMBODIMENTS

Figure 1:
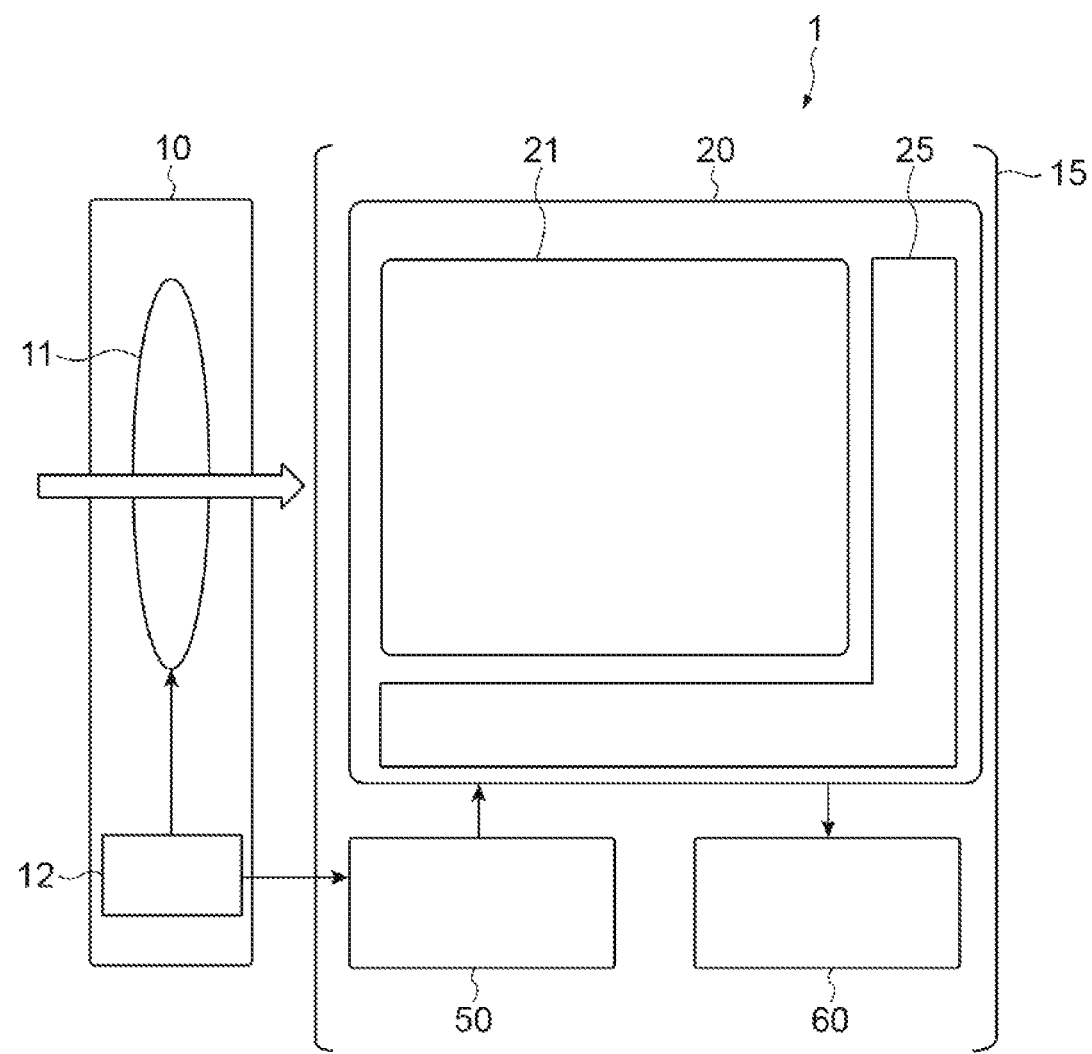
FIG. 1 is a diagram showing a configuration of an imaging device of an embodiment.

Hereinafter, an embodiment for carrying out the present invention will be described in detail with reference to the accompanying drawings. In the description of the drawings, the same components will be denoted by the same reference numerals and the repetitive description will be omitted.

As shown in FIG. 1, an imaging device 1 includes a varifocal lens 10 and an imaging sensor 15.

The varifocal lens 10 forms an image of an imaging object on the imaging sensor 15. The varifocal lens 10 periodically changes the position of the focal point between the farthest point and the closest point. The varifocal lens 10 includes a lens unit 11 and a lens driving unit 12. The lens driving unit 12 provides a lens driving signal to the lens unit 11. As a result, the position of the focal point of the lens unit 11 periodically changes. As such a varifocal lens 10, for example, a lens disclosed in U.S. Patent Application Publication No. 2013/0321927 may be used.

Imaging Sensor

The imaging sensor 15 obtains an image of the imaging object. The imaging sensor 15 includes a pixel circuit unit 20, a pixel control unit 50, and an image processing unit 60. The pixel circuit unit 20 is connected to the pixel control unit 50. The pixel circuit unit 20 is operated in response to the control signal provided by the pixel control unit 50. The operation mentioned herein includes, for example, an exposure operation and a transfer operation. Further, the pixel circuit unit 20 is connected to the image processing unit 60. The pixel circuit unit 20 provides an output signal to the image processing unit 60. The pixel circuit unit 20 includes a pixel array 21 and a peripheral circuit 25. The pixel array 21 and the peripheral circuit 25 are provided on the same semiconductor chip.

Pixel Control Unit

The operation of the varifocal lens 10 and the operation of the pixel circuit unit 20 are synchronized with each other. Here, the pixel control unit 50 receives a reference signal from the varifocal lens 10. The frequency of the reference signal matches the frequency of the lens driving signal. On the other hand, a difference between the phase of the reference signal and the phase of the lens driving signal may be zero or have a predetermined value. For example, the reference signal may be the lens driving signal itself. Then, the pixel control unit 50 provides a control signal generated on the basis of the reference signal to the pixel circuit unit 20.

Image Processing Unit

The image processing unit 60 generates a composite image by using the signal provided from the pixel circuit unit 20. The image processing unit 60 generates first to fourth partial images by using a signal obtained from the pixel circuit unit 20. This partial image means an image acquired from each of different focal positions. Further, the image processing unit 60 generates a composite image by using the first to fourth partial images.

Pixel Circuit Unit

Figure 2:
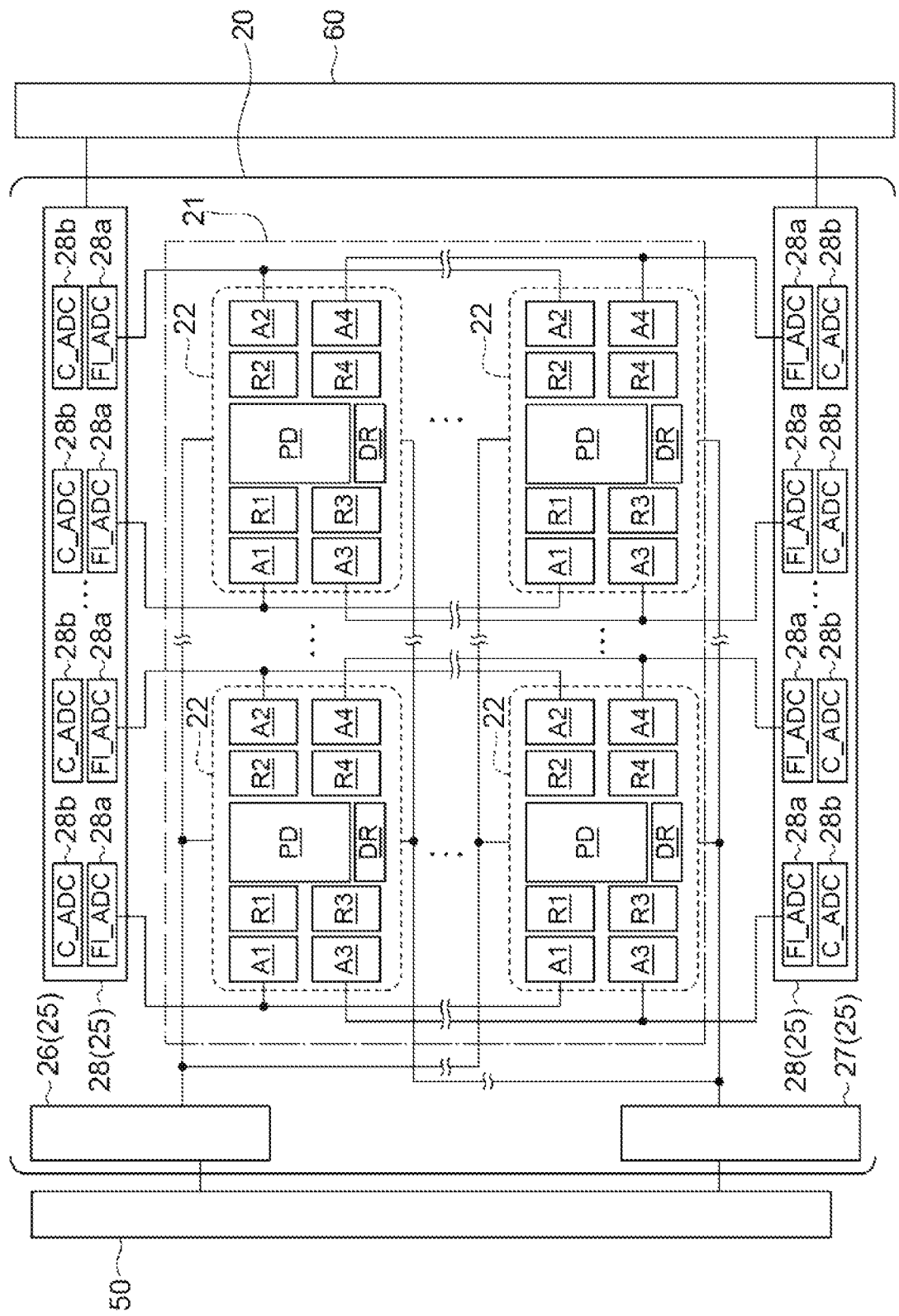
FIG. 2 is a diagram showing a configuration of the imaging sensor shown in FIG. 1.

The pixel circuit unit 20 is disposed to overlap the optical axis of the varifocal lens 10. Then, the pixel circuit unit 20 receives light having passed through the varifocal lens 10 and outputs a signal in response to the light. As shown in FIG. 2, the pixel array 21 of the pixel circuit unit 20 includes a plurality of pixels 22. The plurality of pixels 22 are two-dimensionally arranged. The pixel 22 includes a photoelectric conversion unit PD, electric charge reading regions R1, R2, R3, and R4, buffer amplifiers A1, A2, A3, and A4, and a drain DR (electric charge discharging region).

Here, the electric charge reading region R1 is an electric charge reading region mentioned in claims. Further, the electric charge reading regions R2, R3, and R4 are additional electric charge reading regions mentioned in claims. The drain DR is an electric charge discharging region mentioned in claims.

The peripheral circuit 25 includes a gate control circuit 26 (control means), a reading circuit 27 (signal reading means), and an AD conversion circuit 28. The gate control circuit 26 and the reading circuit 27 are respectively connected to the pixel control unit 50 and the pixel array 21. Specifically, the gate control circuit 26 and the reading circuit 27 are respectively connected to the pixel 22 of the pixel array 21. The gate control circuit 26 and the reading circuit 27 output various signals for controlling the pixel array 21 to the pixel 22.

The gate control circuit 26 is operated on the basis of the signal from the pixel control unit 50. Then, the pixel control unit 50 is operated on the basis of the reference signal from the lens driving unit 12. That is, the gate control circuit 26 is operated on the basis of the reference signal from the lens driving unit 12. On the other hand, the reading circuit 27 may be operated on the basis of the reference signal from the lens driving unit 12. Further, the reading circuit 27 may be operated regardless of the reference signal. That is, the reading circuit 27 can be operated on the basis of a criterion signal different from the reference signal.

The AD conversion circuit 28 is connected to the pixel array 21. The AD conversion circuit 28 converts an output signal received from the pixel array 21 from an analog signal into a digital signal. The AD conversion circuit 28 may include a folding integral type conversion circuit unit 28a and a cyclic type conversion circuit 28b. The AD conversion circuit 28 includes a circuit unit including the folding integral type conversion circuit unit 28a and the cyclic type conversion circuit 28b. The circuit unit is provided for each row. The output of the pixel array 21 is connected to the input of the folding integral type conversion circuit unit 28a. Then, the output of the folding integral type conversion circuit unit 28a is connected to the input of the cyclic type conversion circuit 28b. The output of the cyclic type conversion circuit 28b is connected to the image processing unit 60. The AD conversion circuit 28 outputs an output signal converted into a digital signal to the image processing unit 60.

Such an AD conversion circuit 28 performs a folding integral type AD conversion operation. According to the folding integral type AD conversion operation, it is possible to expand a dynamic range. Further, according to the K-folding integral type AD conversion operation, the signal component of the pixel 22 is multiplied by K. On the other hand, the random noise component is multiplied by √K (square root of K). Thus, the S/N ratio can be improved by √K times.

Further, the AD conversion circuit 28 may respectively include the folding integral type conversion circuit unit 28a and the cyclic type conversion circuit 28b as different circuits. In this case, the folding integral type conversion operation and the cyclic type conversion operation can be performed in parallel. In other words, pipeline processing can be applied. As a result, the AD conversion operation can be speeded up.

On the other hand, the AD conversion circuit 28 may realize the folding integral type conversion circuit unit 28a and the cyclic type conversion circuit 28b by changing a circuit configuration by a switch in one circuit. According to this configuration, the AD conversion circuit 28 can have a single-ended configuration.

Additionally, the AD conversion circuit 28 may include a correlated double sampling circuit (so-called CDS circuit). The CDS circuit reduces noise caused by the reset operations at the electric charge reading regions R1, R2, R3, and R4 to be described later. The CDS circuit outputs a signal excluding a component of a reset level from the signal provided from the pixel 22. The CDS circuit receives the output of the pixel array 21. The CDS circuit outputs a processed signal to the folding integral type conversion circuit unit 28a.

Additionally, the arrangement of the gate control circuit 26, the reading circuit 27, and the AD conversion circuit 28 in the semiconductor chip is not particularly limited. The gate control circuit 26, the reading circuit 27, and the AD conversion circuit 28 may be appropriately set in response to the configuration and the like of the pixel circuit unit 20.

Figure 3:
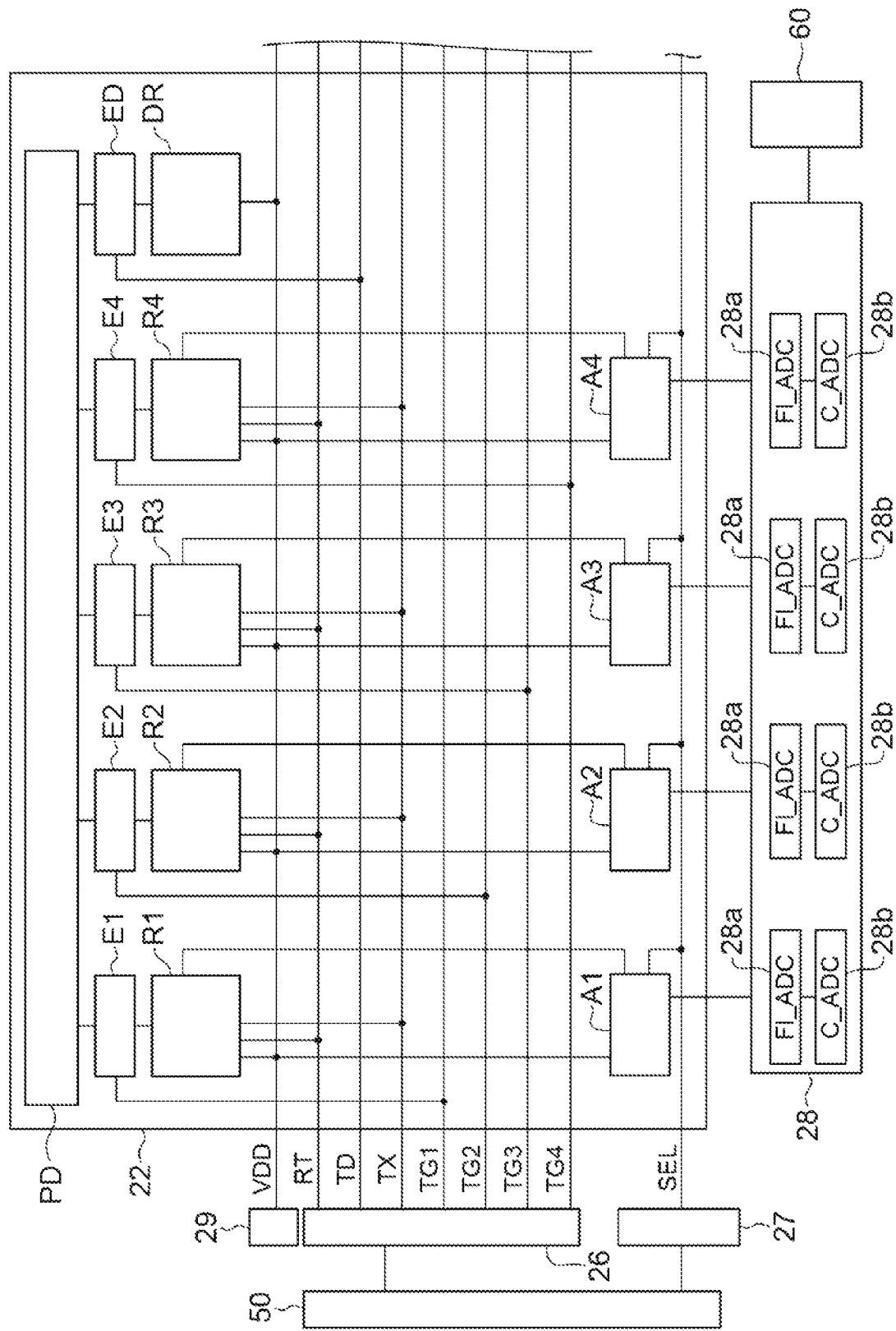
FIG. 3 is a diagram showing a state in which a signal line is connected to a pixel shown in FIG. 2.

More specifically, as shown in FIG. 3, a plurality of signal lines are connected to the pixel 22. Transfer control electrodes E1, E2, E3, and E4 and a discharge control electrode ED of the pixel 22 are connected to the gate control circuit 26 via the signal lines. The transfer control electrode E1 receives a control signal TG1. The transfer control electrode E2 receives a control signal TG2. The transfer control electrode E3 receives a control signal TG3. The transfer control electrode E4 receives a control signal TG4. The discharge control electrode ED receives a control signal TD.

The electric charge reading regions R1, R2, R3, and R4 of the pixel 22 are connected to a power supply 29 via power supply lines. The electric charge reading regions R1, R2, R3, and R4 receive a voltage VDD from the power supply line. Further, the electric charge reading regions R1, R2, R3, and R4 are connected to the gate control circuit 26 via the signal lines. The electric charge reading regions R1, R2, R3, and R4 receive control signals RT and TX from the gate control circuit 26. Further, the electric charge reading regions R1, R2, R3, and R4 are respectively connected to the buffer amplifiers A1, A2, A3, and A4 via the signal lines. The buffer amplifiers A1, A2, A3, and A4 are connected to the AD conversion circuit 28.

The drain DR is connected to the power supply 29 via the power supply line. The drain DR receives the voltage VDD from the power supply line.

The buffer amplifiers A1, A2, A3, and A4 are respectively connected to the reading circuit 27 via the signal lines. The buffer amplifiers A1, A2, A3, and A4 receive a control signal SEL from the reading circuit 27.

Figure 4:
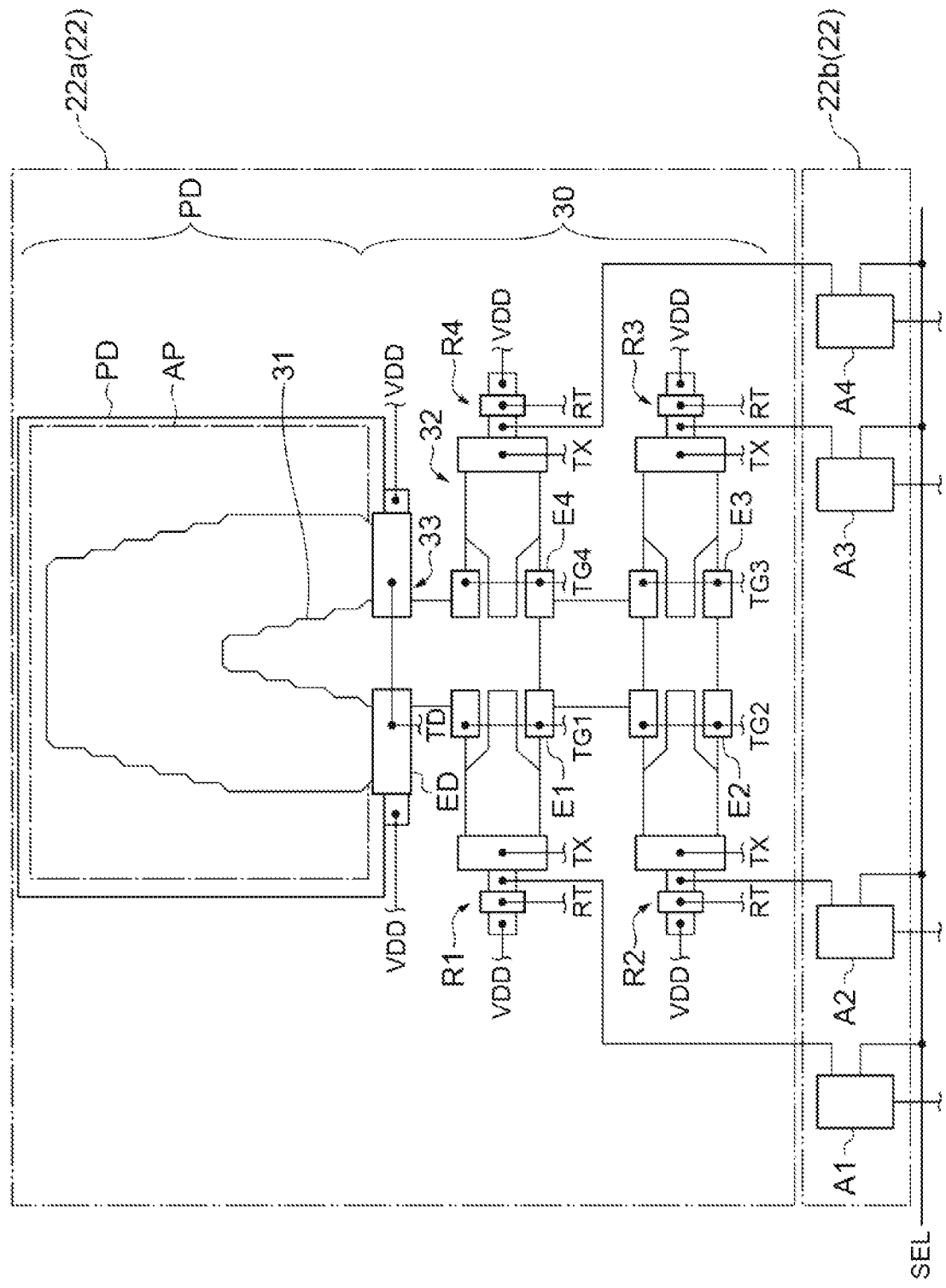
FIG. 4 is a diagram showing a configuration of the pixel shown in FIG. 2.

FIG. 4 is a diagram showing a configuration of the pixel 22. The pixel 22 includes a photodetection unit 22a and an amplifier unit 22b. The photodetection unit 22a generates an electric charge by receiving light. The electric charge is output to the AD conversion circuit 28 via the amplifier unit 22b as a voltage.

The photodetection unit 22a includes a photoelectric conversion unit PD and an electric charge transfer unit 30. The photodetection unit 22a has a structure based on the principle of the lateral electric field controlled charge modulator (LEFM) developed by the present inventors. The lateral electric field controlled electric charge modulator performs high-speed electron transport control in such a manner that the electric field control of the electric charge transport path is performed by utilizing the lateral electric field due to the plurality of gates provided on the side surface of the electric charge transport path. As the lateral electric field controlled electric charge modulator, for example, the configuration shown in Japanese Patent No. 6476138 developed by the present inventors can be adopted.

The photoelectric conversion unit PD generates an electric charge in response to the light received via the aperture AP. The photoelectric conversion unit PD provides an electric charge to the electric charge transfer unit 30.

The electric charge transfer unit 30 receives the electric charge provided from the photoelectric conversion unit PD. The electric charge transfer unit 30 provides a voltage based on the electric charge to the buffer amplifiers A1, A2, A3, and A4. The electric charge transfer unit 30 includes an electric charge collecting region 31, an electric charge distribution unit 32, a drain 33, and electric charge reading regions R1, R2, R3, and R4.

The electric charge collecting region 31 collects the electric charge generated in the photoelectric conversion unit PD. Then, the electric charge distribution unit 32 transfers the collected electric charge to any one of the electric charge reading regions R1, R2, R3, and R4 and the drain 33.

The electric charge distribution unit 32 distributes the electric charge in response to the position of a fecal point P of the varifocal lens 10. The electric charge distribution unit 32 includes transfer control electrodes E1, E2, E3, and E4 (transfer control electrodes) and a discharge control electrode ED. The signal lines are respectively connected to the transfer control electrodes E1, E2, E3, and E4. The transfer control electrode E1 receives the control signal TG1. The transfer control electrode E2 receives the control signal TG2. The transfer control electrode E3 receives the control signal TG3. The transfer control electrode E4 receives the control signal TG4. The transfer control electrodes E1, E2, E3, and E4 transfer an electric charge from the electric charge collecting region 31 to any one of the electric charge reading regions R1, R2, R3, and R4 in response to the control signals TG1, TG2, TG3, and TG4.

The signal line is connected to the discharge control electrode ED. The discharge control electrode ED receives the control signal TD. The discharge control electrode ED controls the transfer of the electric charge from the electric charge collecting region 31 to the drain 33 in response to the control signal TD provided from the signal line.

The power supply 29 is connected to the drain 33. While the photoelectric conversion unit PD receives light, the photoelectric conversion unit PD continuously generates the electric charge. On the other hand, the transfer of the electric charge to the electric charge reading regions R1, R2, R3, and R4 is prohibited while a predetermined process is performed on the electric charge in the electric charge reading regions R1, R2, R3, and R4. The predetermined process for the electric charge is, for example, a reading operation. Here, the drain 33 receives the electric charge generated during the period in which the transfer of the electric charge to the electric charge reading regions R1, R2, R3, and R4 is prohibited. That is, the electric charge is not accumulated in the electric charge reading regions R1, R2, R3, and R4 during a period in which the drain 33 receives the electric charge.

The electric charge reading regions R1, R2, R3, and R4 respectively provide voltages in response to the transferred electric charge to the buffer amplifiers A1, A2, A3, and A4. The electric charge reading regions R1, R2, R3, and R4 differ only in arrangement and connection configuration from each other. Here, the electric charge reading region R1 will be described in detail.

Figure 5:
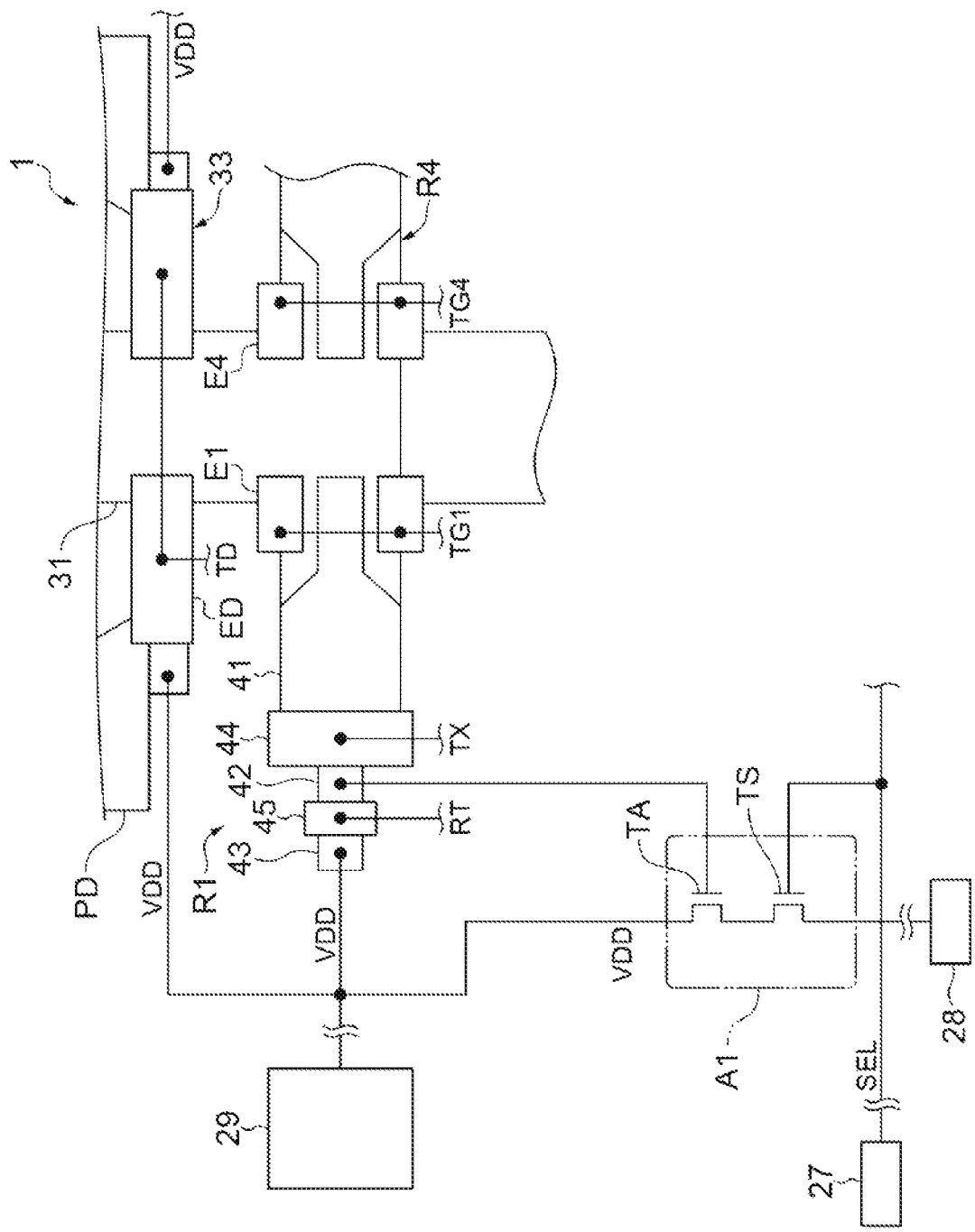
FIG. 5 is a diagram showing a main part of the pixel shown in FIG. 4 in an enlarged state.

As shown in FIG. 5, the electric charge reading region R1 includes an electric charge accumulation portion 41, a floating diffusion portion 42, and a reset drain 43. The electric charge accumulation portion 41 is adjacent to the electric charge collecting region 31. The floating diffusion portion 42 is adjacent to the electric charge accumulation portion 41. Further, the floating diffusion portion 42 is connected to the buffer amplifier A1 via an output line. The reset drain 43 is adjacent to the floating diffusion portion 42. The reset drain 43 is connected to the power supply 29 and receives the voltage VDD.

These regions are regions that temporarily accumulate the electric charge. Then, the transfer of the electric charge between these regions is controlled by the voltage applied by some of the electrodes. The electric charge reading region R1 includes a transfer gate electrode 44 and a reset gate electrode 45. The transfer gate electrode 44 controls the transfer of the electric charge from the electric charge accumulation portion 41 to the floating diffusion portion 42 in response to the control signal TX provided from the signal line. The reset gate electrode 45 resets the floating diffusion portion 42 to the voltage VDD via the reset drain 43 in response to the control signal RT provided from the signal line.

The buffer amplifiers A1, A2, A3, and A4 differ only in arrangement and connection configuration from each other. Here, the buffer amplifier A1 will be described in detail.

The buffer amplifier A1 includes a transistor TA and a transistor TS. The drain of the transistor TA is connected to the power supply 29. The gate of the transistor TA is connected to the floating diffusion portion 42 of the electric charge reading region R1. The source of the transistor TA is connected to the transistor TS. The transistor TS performs switching control whether or not to output the output signal from the buffer amplifier A1. The drain of the transistor TS is connected to the source of the transistor TA. The gate of the transistor TS is connected to the signal line for the control signal SEL. The source of the transistor TS is connected to the signal line for the AD conversion circuit 28. The buffer amplifier A1 outputs a voltage corresponding to the electric charge accumulated in the floating diffusion portion 42 to the signal line in response to the control signal SEL provided to the gate of the transistor TS.

Gate Control Circuit

The gate control circuit 26 generates the control signal provided to the pixel array 21 in response to the control signal provided from the pixel control unit 50. Hereinafter, the operation of the gate control circuit 26 will be described with reference to FIGS. 6, 7, 8, and 9.

Figure 6:
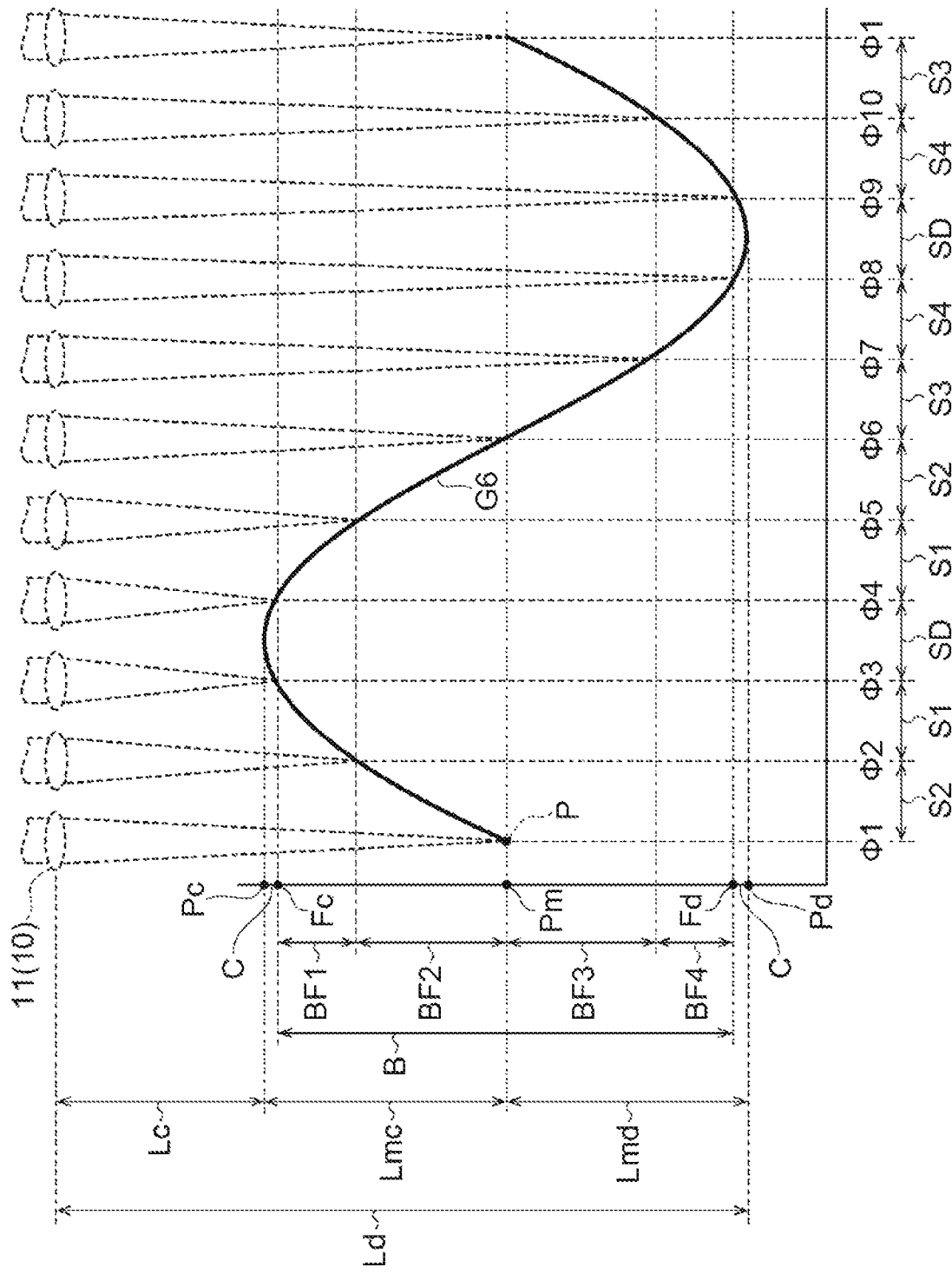
FIG. 6 is a diagram showing a relationship between an operation and a focal range of a varifocal lens.
Figure 7:
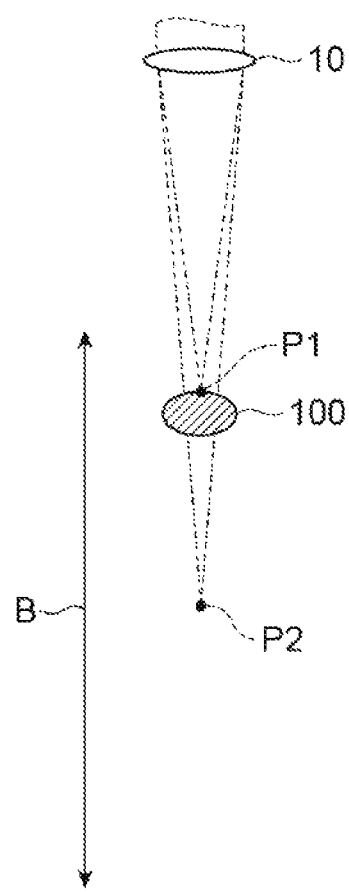
FIG. 7 is a diagram for describing an operation of the imaging device.

FIG. 6 conceptually shows a state in which the position of the focal point P of the varifocal lens 10 periodically changes. Graph G6 shows a relationship between the time (phase) and the position of the focal point P. As shown in Graph G6, the position of the focal point P periodically changes with the passage of time. For example, the position of the focal point P changes in a sinusoidal manner with the passage of time.

The position of the focal point P of the varifocal lens 10 is indicated by a closest point Pc, a farthest point Pd, and a middle point Pm. The closest point Pc is a point in which the distance from the varifocal lens 10 is the shortest. For example, the distance from the varifocal lens 10 to the closest point Pc is indicated by a distance Lc. The farthest point Pd is a point in which the distance from the varifocal lens 10 is farthest. For example, the distance from the varifocal lens 10 to the farthest point Pd is indicated by a distance Ld. The middle point Pm is a center of the distance from the closest point Pc to the farthest point Pd. That is, a distance Lmc from the middle point Pm to the closest point Pc is the same as a distance Lmd from the middle point Pm to the farthest point Pd. The position of the focal point P periodically changes from the closest point Pc to the farthest point Pd.

An imaging range B of the varifocal lens 10 can be set to an arbitrary range from the closest point Pc to the farthest point Pd. The imaging range B is defined by the imaging close point Fc and the imaging far point Fd. The imaging close point Fc and the imaging far point Fd are set between the closest point Pc and the farthest point Pd. For example, the imaging range B becomes maximal when the imaging close point Fc is set to the position of the closest point Pc and the imaging far point Fd is set to the farthest point Pd. Various imaging fluctuations can be realized by setting the imaging close point Fc and the imaging far point Fd. Some fluctuations will be described later as the first to fourth modified examples. The imaging close point Fc of this embodiment is set between the closest point Pc and the middle point Pm. Further, the imaging far point Fd of this embodiment is set between the farthest point Pd and the middle point Pm. According to these settings, the imaging range B becomes a range including the middle point Pm.

Various imaging objects may exist in the imaging range B. For example, in a case in which the imaging object 100 exists on the side close to the varifocal lens 10, a clear image of the imaging object 100 can be obtained if an exposure is performed when the position of the focal point P of the varifocal lens 10 is located at the position of the imaging object 100 (see reference numeral P1 in FIG. 7). However, a clear image of the imaging object 100 cannot be obtained if an exposure is performed when the position of the focal point P of the varifocal lens 10 is not located at the position of the imaging object 100 (see reference numeral P2 of FIG. 7). Thus, the imaging range B is divided into some parts. For example, four parts are set in the imaging range B as shown in FIG. 6. This part is referred to as focal ranges BF1, BF2, BF3, and BF4. Here, the focal range BF1 is a focal range mentioned in claims. Further, the focal ranges BF2, BF3, and BF4 are additional focal ranges mentioned in claims. Then, the mode of the exposure operation is changed for each of the focal ranges BF1, BF2, BF3, and BF4. The exposure operation means an operation of accumulating the electric charge obtained by the exposure. Then, changing the mode of the exposure operation means that the region for accumulating the electric charge obtained by the exposure is made different for each of the focal ranges BF1, BF2, BF3, and BF4.

For example, when the position of the focal point P is located at the focal range BF1, the imaging sensor 15 accumulates the electric charge in the electric charge reading region R1. When the position of the focal point P is located at the focal range BF2, the imaging sensor 15 accumulates the electric charge in the electric charge reading region R2. When the position of the focal point P is located at the focal range BF3, the imaging sensor 15 accumulates the electric charge in the electric charge reading region R3. When the position of the focal point P is located at the focal range BF4, the imaging sensor 15 accumulates the electric charge in the electric charge reading region R4. Additionally, the correspondence relationship between the focal range and the electric charge reading region is not limited to the above-described example and may be appropriately set in response to the configuration or operation of the imaging device.

The position of the focal point P periodically changes as shown in Graph G6 of FIG. 6. Then, in the period of one cycle of the position of the focal point P, for example, the position of the focal point P passes through each of the focal ranges BF1, BF2, BF3, and BF4 twice. Thus, in one cycle, the imaging sensor 15 distributes the electric charge to any one of the corresponding electric charge reading regions R1, R2, R3, and R4 whenever the position of the focal point P passes through the focal ranges BF1, BF2, BF3, and BF4. Then, for example, the electric charge which can be obtained when the position of the focal point P exists in the focal range BF1 is accumulated whenever the position of the focal point P passes through the focal range BF1. Thus, it is possible to increase the amount of the electric charge used to obtain an image corresponding to the focal range BF1 by performing the exposure operation a plurality of times even when the amount of the electric charge accumulated by one exposure operation (accumulation operation) is small. As a result, it is possible to increase the brightness of the obtained image.

In this embodiment, an exposure period S1 corresponding to the focal range BF1, an exposure period S2 corresponding to the focal range BF2, an exposure period S3 corresponding to the focal range BF3, and an exposure period S4 corresponding to the focal range BF4 are set to have the same length. In this case, the lengths of the focal ranges BF1 and BF4 are different from the lengths of the focal ranges BF2 and BF3.

Figure 8:
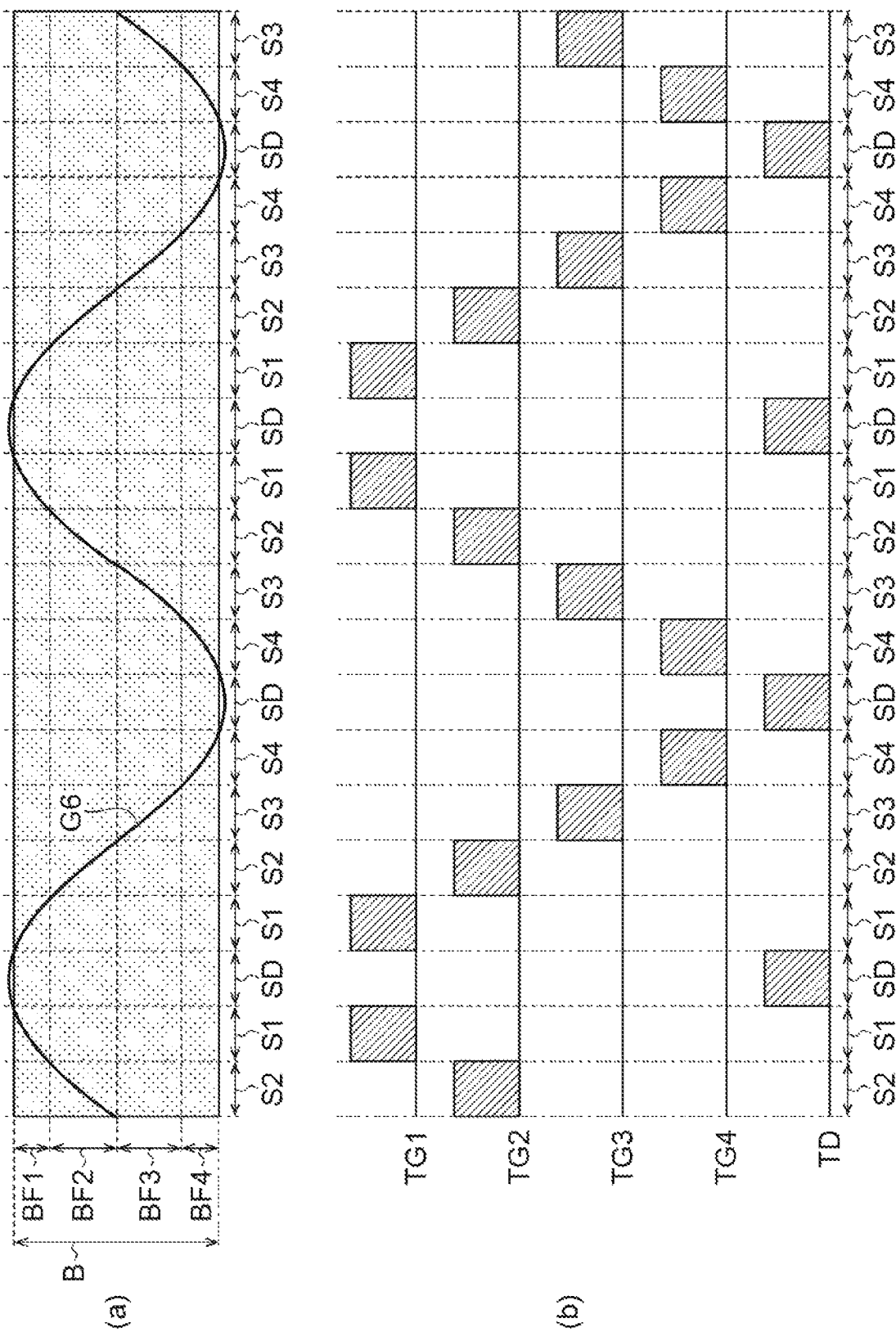
FIG. 8(a) is a graph showing a fluctuation in focal point of the imaging device of the embodiment and FIG. 8(b) is a timing chart showing an operation of the embodiment.

The gate control circuit 26 provides the control signals TG1, TG2, TG3, TG4, and TD shown in the timing chart of FIG. 8 to the pixel array 21. Additionally, the control signal TG1 is a transfer control signal. Further, the control signals TG2, TG3, and TG4 are additional transfer control signals. Then, the control signal TD is a discharge control signal.

First, the gate control circuit 26 applies the following control signals TG1, TG2, TG3, TG4, and TD to the pixel array 21 during the period S2 from the phase Φ1 to the phase Φ2. The period S2 from the phase Φ1 to the phase Φ2 corresponds to the focal range BF2. According to the control signals TG1, TG2, TG3, TG4, and TD, the electric charge is accumulated in the electric charge reading region R2. Additionally, "LOW" means that the transfer of the electric charge is prohibited. "HIGH" means that the transfer of the electric charge is permitted.

TG1: LOW.
TG2: HIGH.
TG3: LOW.
TG4: LOW.
TD: LOW.

Next, the gate control circuit 26 provides the following control signals TG1, TG2, TG3, TG4, and TD (first control signal) to the pixel array 21 during the period S1 from the phase Φ2 to the phase Φ3. The period S1 from the phase Φ2 to the phase Φ3 corresponds to the focal range BF1. According to the control signals TG1, TG2, TG3, TG4, and TD, the electric charge is accumulated in the electric charge reading region R1.

TG1: HIGH.
TG2: LOW.
TG3: LOW.
TG4: LOW.
TD: LOW.

Next, the gate control circuit 26 provides the following control signals TG1, TG2, TG3, TG4, and TD to the pixel array 21 during the period SD from the phase Φ3 to the phase Φ4. The period SD from the phase Φ3 to the phase Φ4 is the non-imaging period. According to the control signals TG1, TG2, TG3, TG4, and TD, the electric charge is discharged to the drain 33.

TG1: LOW.
TG2: LOW.
TG3: LOW.
TG4: LOW.
TD: HIGH.

Next, the gate control circuit 26 provides the following control signals TG1, TG2, TG3, TG4, and TD to the pixel array 21 during the period S1 from the phase Φ4 to the phase Φ5. The period S1 from the phase Φ4 to the phase Φ5 corresponds to the focal range BF1. According to the control signals TG1, TG2, TG3, TG4, and TD, the electric charge is accumulated in the electric charge reading region R1 again.
TG1: HIGH.
TG2: LOW.
TG3: LOW.
TG4: LOW.
TD: LOW.

Next, the gate control circuit 26 provides the following control signals TG1, TG2, TG3, TG4, and TD to the pixel array 21 during the period S2 from the phase Φ5 to the phase Φ6. The period S2 from the phase Φ5 to the phase Φ6 corresponds to the focal range BF2. According to the control signals TG1, TG2, TG3, TG4, and TD, the electric charge is accumulated in the electric charge reading region R2 again.
TG1: LOW.
TG2: HIGH.
TG3: LOW.
TG4: LOW.
TD: LOW.

Next, the gate control circuit 26 provides the following control signals TG1, TG2, TG3, TG4, and TD to the pixel array 21 during the period S3 from the phase Φ6 to the phase Φ7. The period S3 from the phase Φ6 to the phase Φ7 corresponds to the focal range BF3. According to the control signals TG1, TG2, TG3, TG4, and TD, the electric charge is accumulated in the electric charge reading region R3.
TG1: LOW.
TG2: LOW.
TG3: HIGH.
TG4: LOW.
TD: LOW.

Next, the gate control circuit 26 provides the following control signals TG1, TG2, TG3, TG4, and TD to the pixel array 21 during the period S4 from the phase Φ7 to the phase Φ8. The period S4 from the phase Φ7 to the phase Φ8 corresponds to the focal range BF4. According to the control signals TG1, TG2, TG3, TG4, and TD, the electric charge is accumulated in the electric charge reading region R4.
TG1: LOW.
TG2: LOW.
TG3: LOW.
TG4: HIGH.
TD: LOW.

Next, the gate control circuit 26 provides the following control signals TG1, TG2, TG3, TG4, and TD to the pixel array 21 during the period SD from the phase Φ8 to the phase Φ9. The period SD from the phase Φ8 to the phase Φ9 is the non-imaging period. According to the control signals TG1, TG2, TG3, TG4, and TD, the electric charge is discharged to the drain 33.
TG1: LOW.
TG2: LOW.
TG3: LOW.
TG4: LOW.
TD: HIGH.

Next, the gate control circuit 26 provides the following control signals TG1, TG2, TG3, TG4, and TD to the pixel array 21 during the period S4 from the phase Φ9 to the phase Φ10. The period S4 from the phase Φ9 to the phase Φ10 corresponds to the focal range BF4. According to the control signals TG1, TG2, TG3, TG4, and TD, the electric charge is accumulated in the electric charge reading region R4 again.
TG1: LOW.
TG2: LOW.
TG3: LOW.
TG4: HIGH.
TD: LOW.

Then, the gate control circuit 26 provides the following control signals TG1, TG2, TG3, TG4, and TD to the pixel array 21 during the period S3 from the phase Φ10 to the phase Φ1. The period from the phase Φ10 to the phase Φ1 corresponds to the focal range BF3. According to the control signals TG1, TG2, TG3, TG4, and TD, the electric charge is accumulated in the electric charge reading region R3 again.
TG1: LOW.
TG2: LOW.
TG3: HIGH.
TG4: LOW.
TD: LOW With the above-described operation, the exposure operation for one cycle at the position of the focal point P is completed. Hereinafter, the exposure operation is repeated during the frame period.

After the frame period elapses, the voltages corresponding to the electric charges respectively accumulated in the electric charge reading regions R1, R2, R3, and R4 are output to the AD conversion circuit 28 by the reading circuit 27. Then, the image processing unit 60 generates an image for each of the electric charge reading regions R1, R2, R3, and R4 by using a signal output from the AD conversion circuit 28. As a result, the first to fourth partial images are obtained. The image processing unit 60 may use the output result as the partial image or use the output result as the composite image in which the partial images are combined into one image.

<Operation and Effect>

The imaging device 1 includes the varifocal lens 10. In this varifocal lens 10, the position of the focal point P periodically changes between the farthest point Pd and the closest point Pc during the frame period. Then, the gate control circuit 26 transfers the electric charge generated in the photoelectric conversion unit PD when the position of the focal point P is in the focal range BF1 to the electric charge reading region R1 and transfers the electric charge to the drain DR when the position of the focal point P is in a non-imaging range C. Further, the gate control circuit 26 repeats the transfer to the electric charge reading region R1 and the transfer to the drain DR during the frame period. As a result, the electric charge obtained when the position of the focal point P is in the focal range BF1 is accumulated in the electric charge reading region R1 whenever these transfer operations are repeated. That is, even when the amount of the electric charge transferred in one transfer operation is small, the electric charge amount accumulated in the electric charge reading region R1 increases by repeating the transfer operation. Thus, it is possible to increase the brightness of the obtained image in accordance with an increase in electric charge amount.

The pixel circuit unit 20 of the imaging device 1 further includes the electric charge reading regions R2 to R4 in addition to the electric charge reading region R1. According to this configuration, it is possible to set a plurality of focal ranges BF1 to BF4 in the imaging range B. Thus, it is possible to obtain a clear and focused image.

The gate control circuit 26 generates a first control signal and a second control signal so that the period S1 that permits the transfer of the electric charge from the photoelectric conversion unit PD to the electric charge reading region R1 becomes the same as the period S2 that permits the transfer of the electric charge from the photoelectric conversion unit PD to the electric charge reading region R2. According to this configuration, the transfer operation is switched at a predetermined time interval. Thus, it is possible to simplify the control by the gate control circuit 26.

Further, switching the transfer operation at a predetermined time interval means that the exposure time for each of the focal ranges BF1 to BF4 is constant. Assuming that the intensity of the light incident on the imaging sensor 15 does not change with time, the amount of the electric charge obtained for each of the focal ranges BF1 to BF4 is substantially constant when the exposure time is constant. The amount of the electric charge finally corresponds to the brightness (luminance) of the image. That is, the brightness of each image obtained for each of the focal ranges BF1 to BF4 can be made constant.

The gate control circuit 26 performs an operation of outputting the first control signal twice and an operation of outputting the second control signal twice for one cycle of the change of the position of the focal point P. According to this configuration, the amount of the electric charge transferred to the gate control circuit 26 increases. Thus, it is possible to further increase the brightness of the obtained image.

The varifocal lens 10 includes the lens unit 11 through which light is transmitted and the lens driving unit 12 which periodically changes the position of the focal point P of the lens unit 11 by providing the lens driving signal to the lens unit 11. The gate control circuit 26 receives the lens driving signal from the lens driving unit 12. The gate control circuit 26 generates the first and second control signals on the basis of the lens driving signal. According to this configuration, it is possible to synchronize the operation of the lens unit 11 with the operation of the pixel circuit unit 20.

Additionally, the present invention is not limited to the above-described embodiment. For example, the gate control circuit 26 may output the control signal based on the timing chart shown in FIGS. 9, 10, 11, 12, 13, and 14 instead of the timing chart shown in FIG. 8.

First Modified Example

Figure 9:
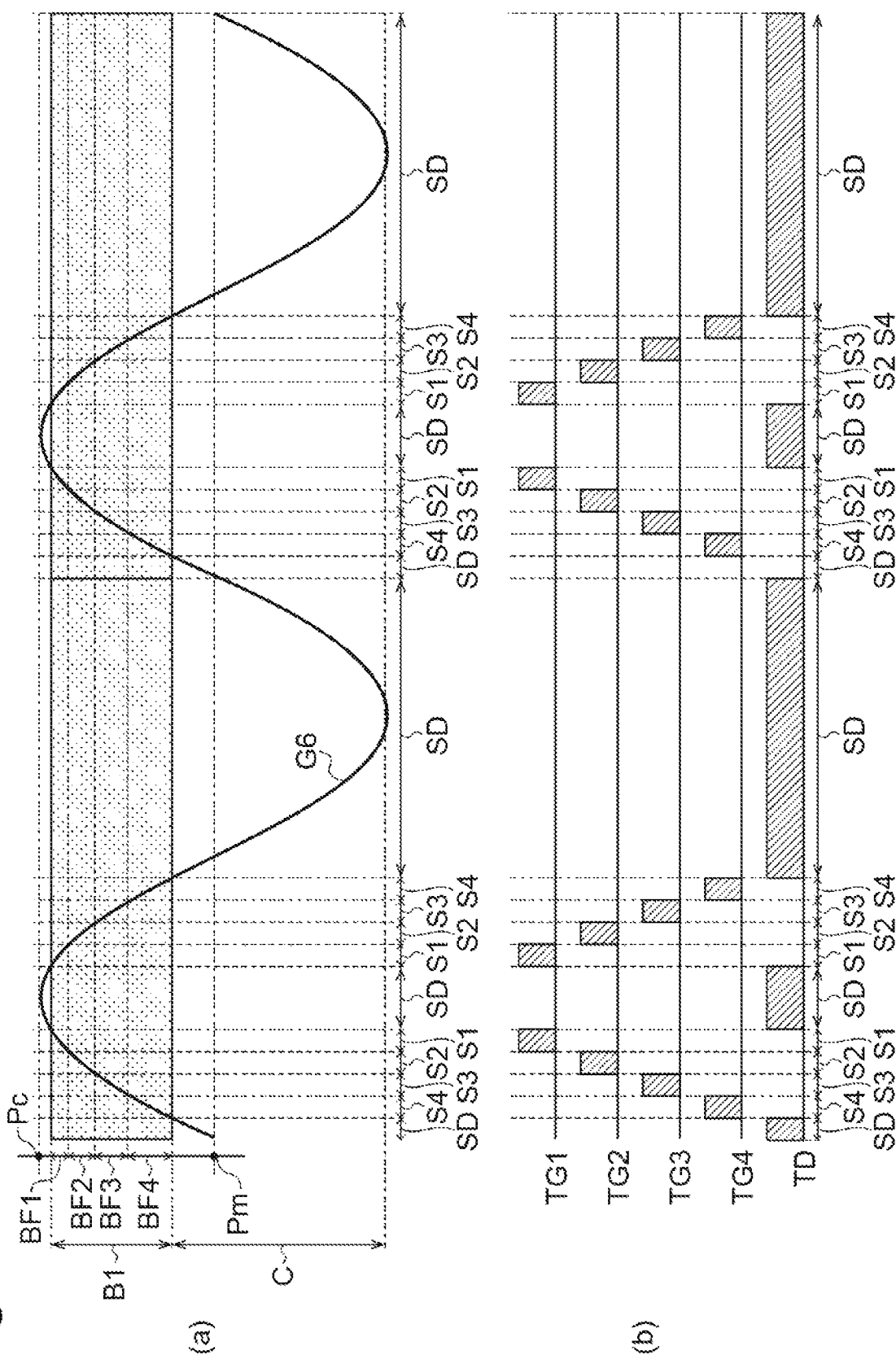
FIG. 9(a) is a graph showing a fluctuation in focal point of an imaging device of the first modified example and FIG. 9(b) is a timing chart showing an operation of the first modified example.

In the embodiment, the imaging range B is set to a wide region from the vicinity of the closest point Pc to the vicinity of the farthest point Pd. That is, the imaging range B is set to a region which is considered to be equal to the range from the closest point Pc to the farthest point Pd of the varifocal lens 10. The imaging range B may be set in a desired manner in the range from the closest point Pc to the farthest point Pd. FIG. 9 shows a timing chart of a first modified example. As shown in FIG. 9, an imaging range B1 may be narrower than the half of the amplitude of the focal point P. Then, the imaging range B1 may be set from the closest point Pc to the middle point Pm. Then, in the focal range (non-imaging range C) not included in the imaging range B1, all electric charges generated in the photoelectric conversion unit PD are discharged to the drain DR. For example, the gate control circuit 26 sets the control signal TD to HIGH during the period SD shown in FIG. 9. According to such an imaging range B1, it is possible to narrow the ranges of the focal ranges BF1, BF2, BF3, and BF4. Thus, it is possible to more precisely focus on the imaging object. That is, it is possible to obtain a clearer image.

Second Modified Example

Figure 10:
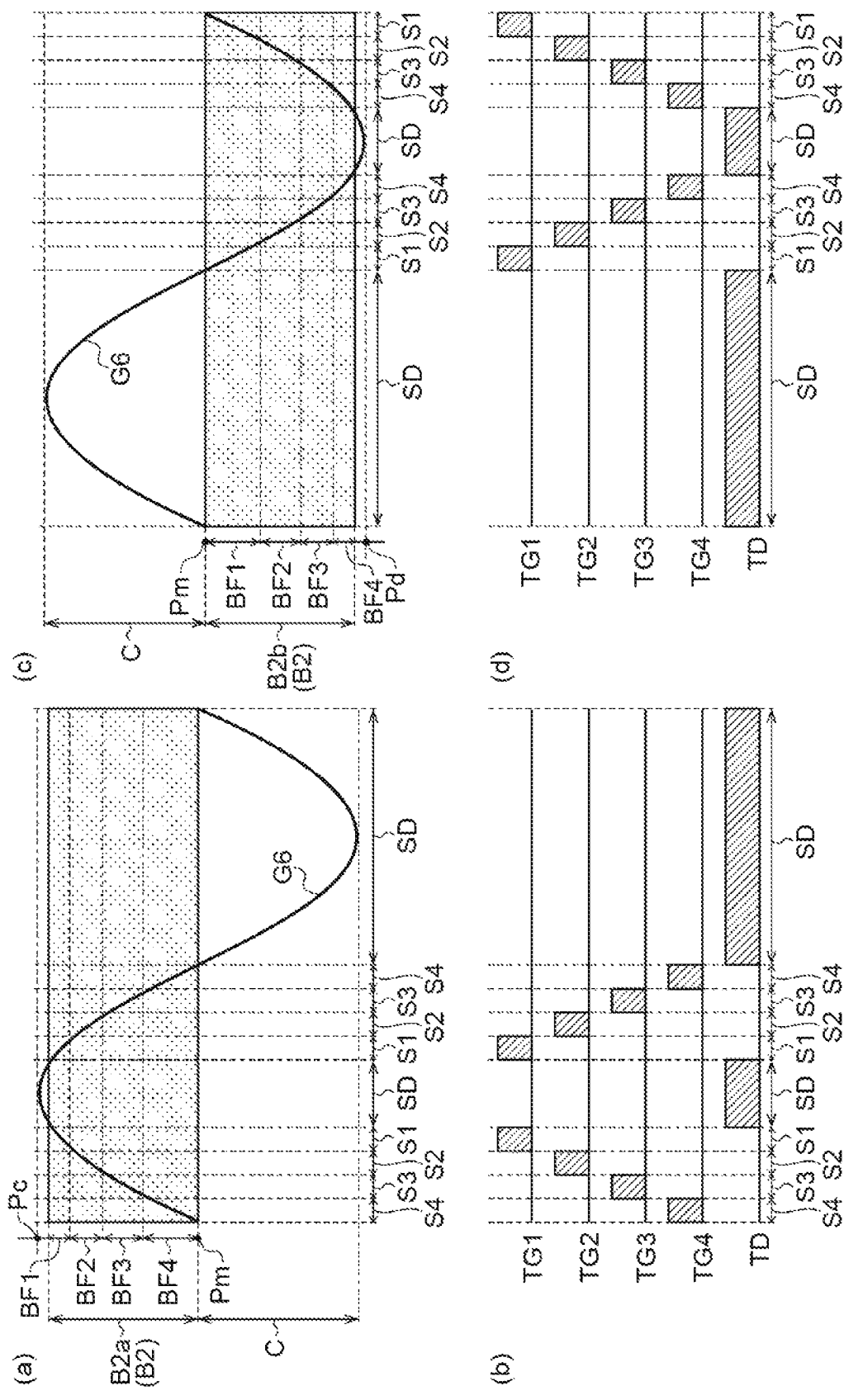
FIGS. 10(a) and 10(c) are graphs showing a fluctuation in focal point of an imaging device of the second modified example and FIGS. 10(b) and 10(d) are timing charts showing an operation of the second modified example.

In the operation of the first modified example, it is possible to more precisely focus on the imaging object. On the other hand, the imaging range B1 is limited. Here, a second modified example shows an operation capable of widening the imaging range while maintaining precise focusing. FIG. 10 shows a timing chart of the second modified example.

In the second modified example, the concept of so-called subframe period is introduced. In the frame period, the periodic fluctuation of the focal point P is repeated, for example, N times. The gate control circuit 26 performs an operation (FIGS. 10(a) and 10(b)) targeting an imaging range B2a in n out of N times. The period for one cycle shown in the same timing chart as this first modified example is referred to as a first subframe operation. The period in which the first subframe operation is repeated n times is referred to as a first subframe period. Further, the gate control circuit 26 performs an operation (FIGS. 10(c) and 10(d)) shown in another timing chart for an imaging range B2b in the remaining (N-n) times. The period for one cycle shown in FIGS. 10(c) and 10(d) is referred to as a second subframe operation. The period in which the second subframe operation is repeated n times is referred to as a second subframe period.

That is, the frame period includes the first subframe period in which the first subframe operation is performed a plurality of times and the second subframe period in which the second subframe operation is performed a plurality of times.

The imaging range B2b set in the second subframe operation does not overlap the imaging range B2a set in the first subframe operation. That is, in the second subframe operation, the imaging range B2b is set to a region different from that of the first subframe operation. As shown in FIG. 10(c) and FIG. 10(d), the imaging range B2b of the second subframe operation may be set from the furthest point Pd to the middle point Pm. Then, in the operation of the second modified example, a total imaging range B2 is the sum of the imaging range B2a for the first subframe operation and the imaging range B2b for the second subframe operation. That is, the imaging range B2 can be widened and the imaging object can be focused more precisely in the imaging ranges B2a and B2b.

In short, the gate control circuit 26 sets the first subframe period and the second subframe period included in the frame period. In the first subframe period, the imaging range B2a is set between the middle point Pm and the closest point Pc. In the second subframe period, the imaging range B2b is set between the middle point Pm and the farthest point. According to this configuration, it is possible to set a fine focal range. Further, it is possible to set a wide imaging range B2.

Further, the number of the subframe periods set in the frame period is not limited to two. For example, the frame period may include the first subframe period in which the first subframe operation is performed a plurality of times, the second subframe period in which the second subframe operation is performed a plurality of times, and a third subframe period in which a third subframe operation is performed a plurality of times.

Third Modified Example

In the second modified example, the imaging range B2a (see FIG. 10(a)) was set in the first subframe period and the imaging range B2b (see FIG. 10(c)) was set in the second subframe period. These imaging ranges B2a and B2b did not overlap each other in the movement direction of the focal point P of the varifocal lens 10. It is not limited to that the imaging ranges set for the subframe periods did not overlap each other. That is, the imaging ranges set for the subframe periods may overlap each other. This overlapping may be an exact overlapping or a partial overlapping.

Figure 11:
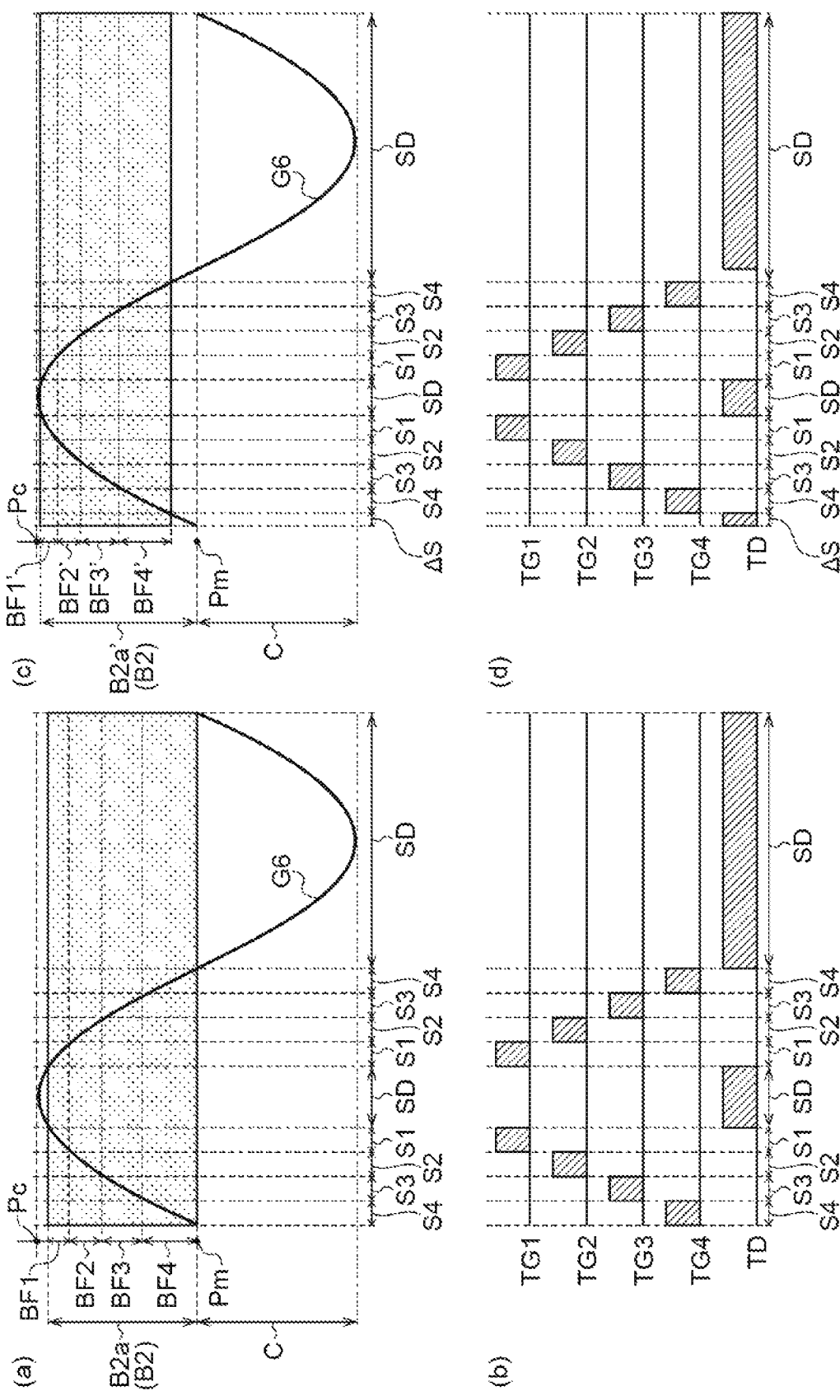
FIGS. 11(a) and 11(c) are graphs showing a fluctuation in focal point of an imaging device of the third modified example and FIGS. 11(b) and 11(d) are timing charts showing an operation of the third modified example.
Figure 12:
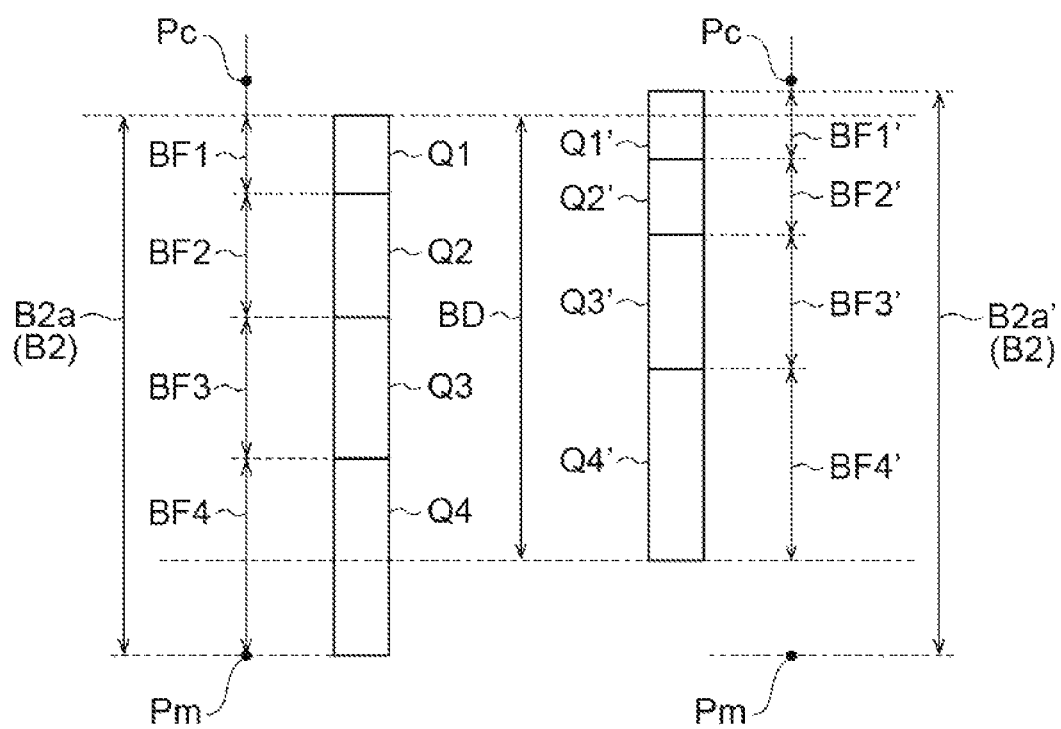
FIG. 12 is a diagram illustrating an imaging range of the imaging device of the third modified example.
Figure 13:
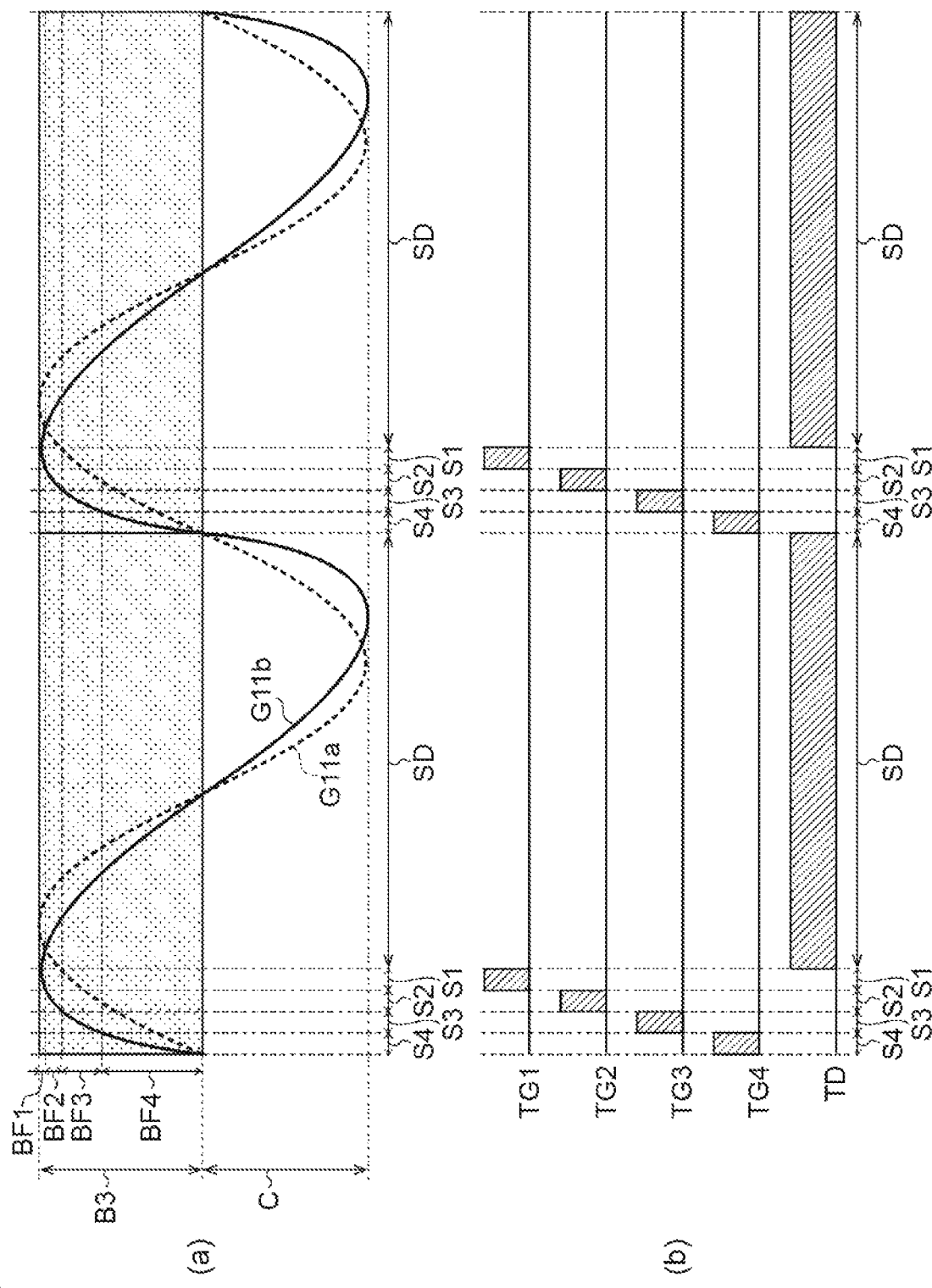
FIG. 13(a) is a graph showing a fluctuation ill focal point of an imaging device of the fourth modified example and FIG. 13(b) is a timing chart showing an operation of the fourth modified example.
Figure 14:
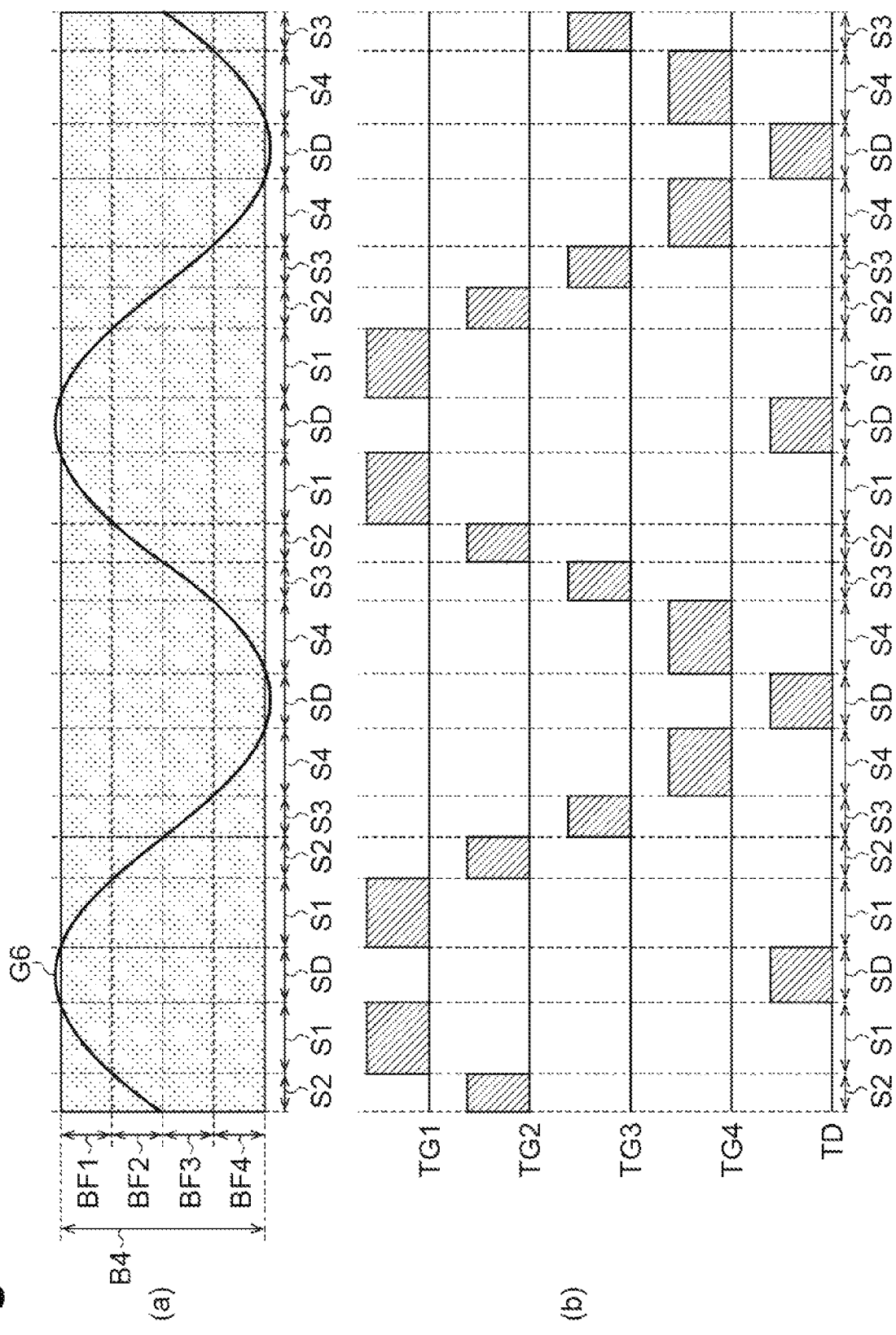
FIG. 14(a) is a graph showing a fluctuation in focal point of an imaging device of the fifth modified example and FIG. 14(b) is a timing chart showing an operation of the fifth modified example.

FIGS. 11 and 12 show an example of a case in which the imaging ranges overlap each other. FIG. 11(a) shows the imaging range B2a in the first subframe period. Further, FIG. 11(b) shows a timing chart in the first subframe period. The operation in the first subframe period is the same as that of the second modified example.

Then, FIG. 11(c) shows an imaging range B2a' of the second subframe period. Further. FIG. 11(d) shows a timing chart in the second subframe period. The imaging range B2a of the first subframe period is set from the middle point Pm to the closest point Pc. The imaging range B2a' of the second subframe period is also set from the middle point Pm to the closest point Pc. As shown in FIG. 11(c) and FIG. 11(d), in the second subframe operation repeated during the second subframe period, the control signals TG1 to TG4 and TD are output with a delay of the period ΔS from the time when the position of the focal point P is the middle point Pm. Then, focal ranges BF1' to BF4' corresponding to the control signals TG1 to TG4 are set closer to the closest point Pc as shown in FIG. 11(c).

Then, as shown in FIG. 12, the focal ranges BF1 to BF4 are set in the imaging range B2a during the first subframe period. Similarly, the focal ranges BF1' to BF4' are set in the imaging range B2a' during the second subframe period. These focal ranges BF1 to BF4 and BF1' to BF4' constitute an overlapping range BD. Then, the images Q1 to Q4 are obtained from the first subframe period in the overlapping range BD. Further, the images Q1' to Q4' are obtained from the second subframe period in the overlapping range BD.

The imaging range including the images Q1 to Q4 and the imaging range including the images Q1' to Q4' are the mutual overlapping range BD. On the other hand, in the overlapping range BD, the focal ranges BF1 to BF4 corresponding to the images Q1 to Q4 and the focal range BF1' to BF4' corresponding to the images Q1' to Q4' are different from each other. That is, according to the operation of the third modified example, it is possible to obtain the plurality of images Q1 to Q4 and Q1' to Q4' in the same range with different focal ranges.

That is, according to the subframe operation of the third modified example, it is possible to obtain the plurality of images Q1 to Q4 and Q1' to Q4' which are different focal ranges in the overlapping range BD. As a result, it is possible to obtain a clear image when imaging an imaging object having a complex uneven shape.

Fourth Modified Example

The focal point P passes through the same focal ranges BF1, BF2, BF3, and BF4 twice for one cycle. Then, in the operations of the embodiment and the first and second modified examples, the transfer operation was performed on each of the focal ranges BF1, BF2, BF3, and BF4 twice for one cycle of the focal point P. However, the transfer operation may be performed only once for one cycle of the focal point P.

FIG. 13(a) and FIG. 13(b) show a timing chart of a fourth modified example. As shown in FIG. 13(a), even when the fluctuation of the position of the focal point P is a sine wave shown in Graph G11a. the waveform of the reference signal obtained from the varifocal lens 10 may be distorted as shown in Graph G11b. Also in such a case, the focal point P passes through the same focal ranges BF1, BF2, BF3, and BF4 twice. However, it is difficult to accurately control the transfer after exactly knowing when to pass at the first time and when to pass at the second time. If the timing is deviated, the electric charge accumulated in a certain electric charge reading region can come from two focal ranges. Further, even if the waveform of the reference signal is not distorted, the same thing can occur when a phase deviation occurs between the waveform showing the actual fluctuation of the focal point P and the waveform of the reference signal.

Here, in the operation of the fourth modified example, the transfer operation to the electric charge reading regions R1, R2, R3, and R4 is performed only once for one cycle of the focal point P. According to such an operation, it is possible to suppress the influence of an unintended deviation between the waveform indicating the actual fluctuation of the focal point P and the reference signal. This unintended deviation includes the above-described waveform distortion and phase deviation. That is, according to this configuration, the synchronization condition between the periodic movement of the focal position of the varifocal lens 10 and the transfer operation by the gate control circuit 26 can be relaxed.

Fifth Modified Example

In the operations of the embodiment and the first to fourth modified examples, the transfer time from the photoelectric conversion unit PD to the electric charge reading regions R1, R2, R3, and R4 was made constant. For example, as shown in FIG. 8(b), the periods S1, S2, S3, and S4 of outputting the control signals TG1, TG2, TG3, and TG4 were the same. That is, in the operations of the embodiment and the first to fourth modified examples, the time was selected as the reference of the operation. The time may be regarded as a phase. The movement amount of the focal point P per unit time is different in response to the frequency of the focal point P. Then, when the time is constant, the focal range is different in response to the frequency of the focal point P.

For example, the focal ranges BF1, BF2, BF3, and BF4 may be selected as the reference of the operation instead of the time. That is, in the fifth modified example, as shown in FIG. 14(a), the focal ranges BF1, BF2, BF3, and BF4 are made constant. Then, as shown in FIG. 14(b), the periods S1, S2, S3, and S4 of outputting the control signals TG1, TG2, TG3, and TG4 are adjusted. Thus, the lengths of the periods S1, S2, S3, and S4 are not constant.

In short, the gate control circuit 26 generates the first control signal and the second control signal so that the change amount of the position of the focal point P during the period S1 in which the transfer of the electric charge from the photoelectric conversion unit PD to the electric charge reading region R1 is permitted becomes the same as the change amount of the position of the focal point P during the period S2 in which the transfer of the electric charge from the photoelectric conversion unit PD to the electric charge reading region R2 is permitted. According to this configuration, the length of each focal range can be made constant.

As described in the operation and effect of the embodiment, the length of each of the periods S1 to S4 corresponds to the brightness of each image. As in the embodiment and the like, when the length of each of the periods S1 to S4 is made constant, the brightness for each image can be made constant. On the other hand, as in the fifth modified example, when the periods S1 to S4 are set so that the length of the focal range is constant, the lengths of the periods S1, S2, S3, and S4 are not constant. As a result, the brightness for each image can be different. Here, in the fifth modified example, the brightness (luminance) of the image may be corrected. For example, a correction coefficient according to the lengths of the periods S1 to S4 may be multiplied by the image obtained for each of the focal ranges BF1 to BF4.

In the first to fourth modified examples, the modified examples relating to the timing chart are shown. As the other modified examples. the modified examples of the hardware shown in the sixth and seventh modified examples may be applied.

Sixth Modified Example

Figure 15:
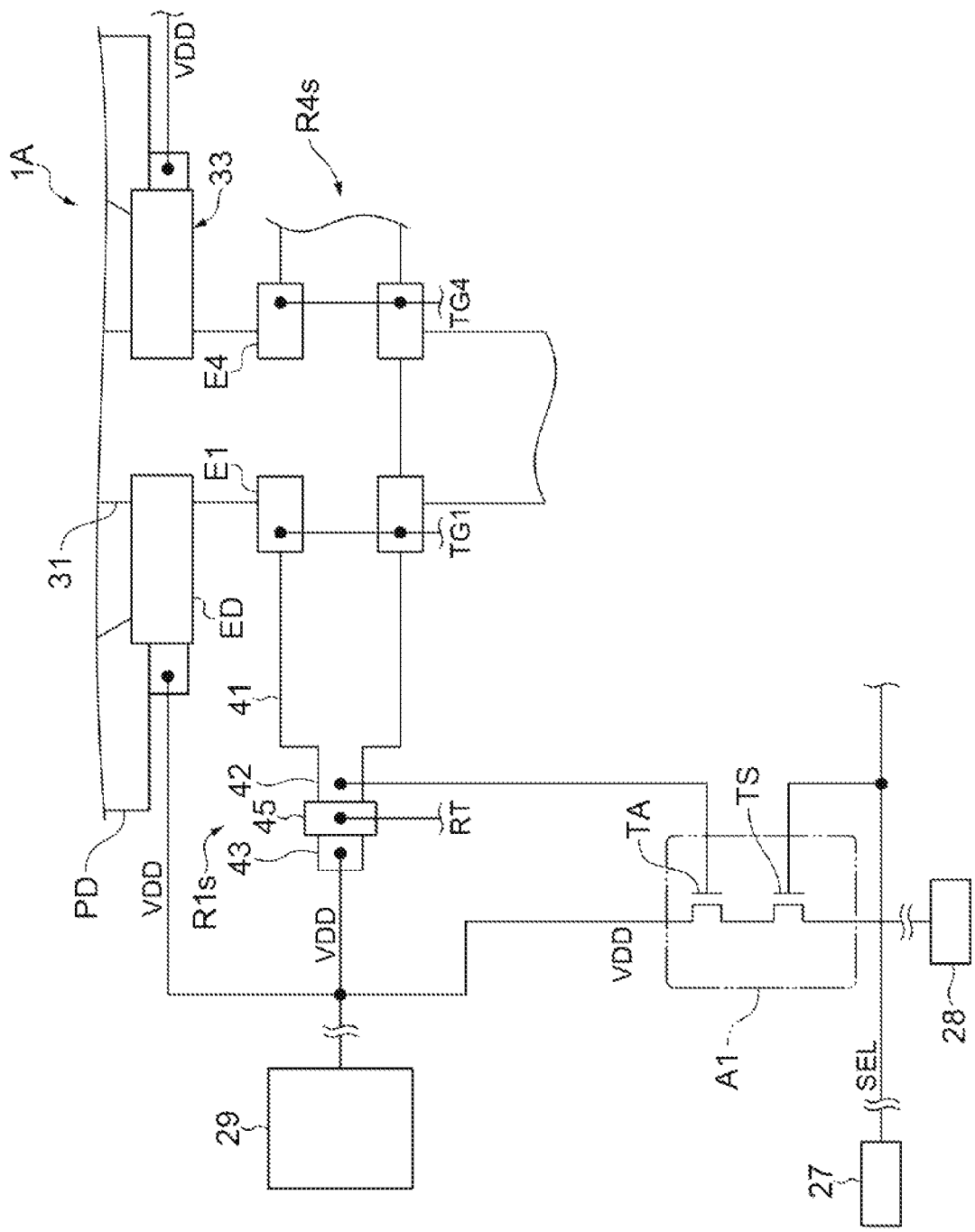
FIG. 15 is a diagram showing a main part of a pixel provided in an imaging device of the sixth modified example in an enlarged state.

In the embodiment, a so-called two-stage transfer structure was adopted in the electric charge reading region R1 and the like. For example, an electric charge reading region R1s may adopt a one-stage transfer structure instead of the two-stage transfer structure as in an imaging device 1A of a sixth modified example shown in FIG. 15. The transfer gate electrode 44 is omitted in the electric charge reading region R1s. The electric charge reading region R1s is a component in which the electric charge accumulation portion 41 and the floating diffusion portion 42 are electrically integrated with each other. According to such a configuration, it is possible to simplify the configuration of the electric charge reading region R1s.

Seventh Modified Example

The pixel 22 of the embodiment included the photoelectric conversion unit PD, four electric charge reading regions R1, R2, R3, and R4, four buffer amplifiers A1, A2, A3, and A4, and the drain DR. The number of the electric charge reading regions and the buffer amplifiers corresponds to the number of the focal ranges set in the imaging range. In the embodiment, the number of the focal ranges set in the imaging range was four. Thus, the number of each of the electric charge reading regions and the buffer amplifiers was four.

Figure 16:
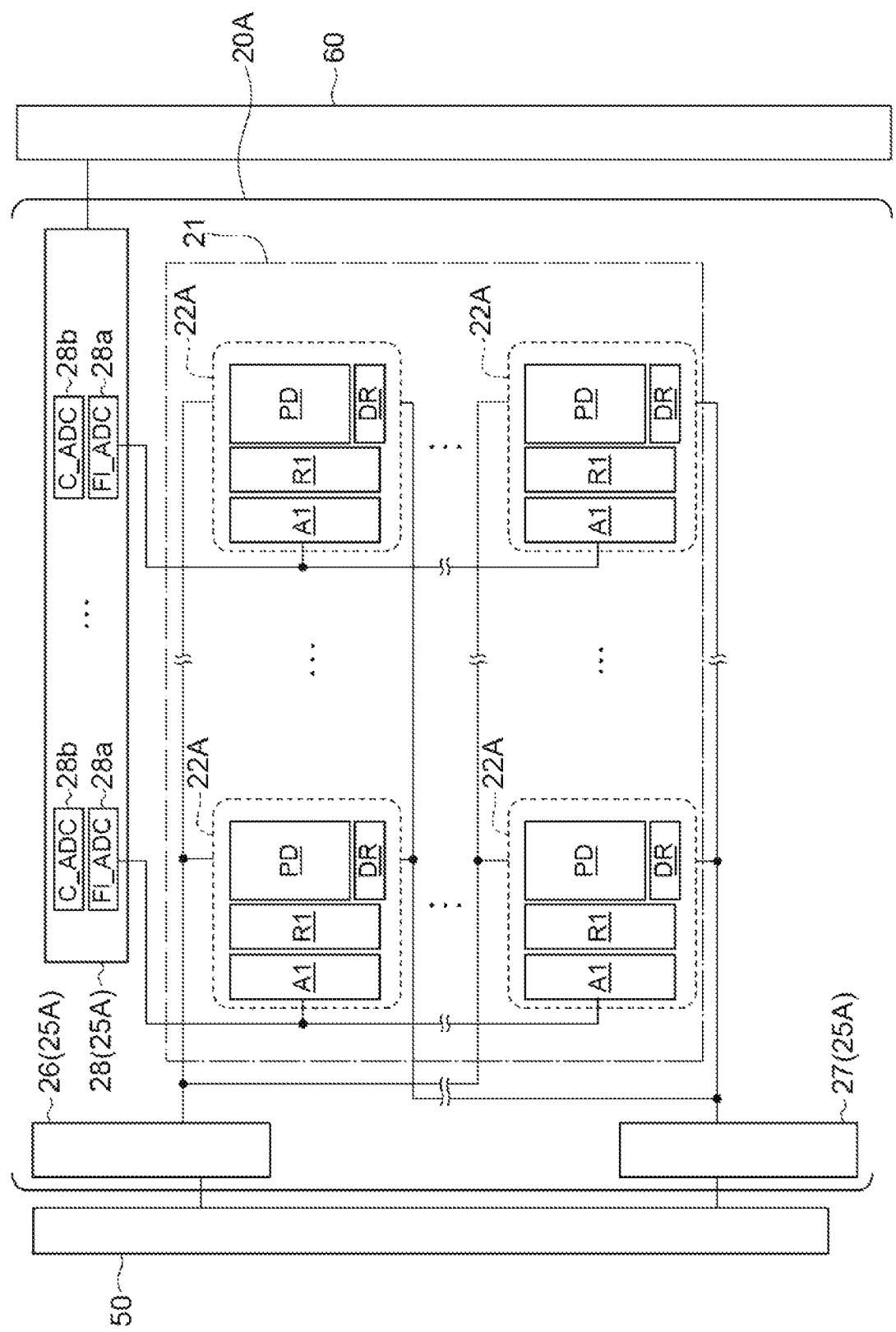
FIG. 16 is a diagram showing a configuration of an imaging sensor of the seventh modified example.

The number of the focal ranges set in the imaging range may be one, two, or three. Further, the number of the focal ranges set in the imaging range may be five or more. For example, when the number of the focal ranges set in the imaging range was one, as shown in FIG. 16, a pixel 22A constituting a pixel circuit unit 20A may include the photoelectric conversion unit PD, one electric charge reading region R1, one buffer amplifier A1, and the drain DR.

Figure 17:
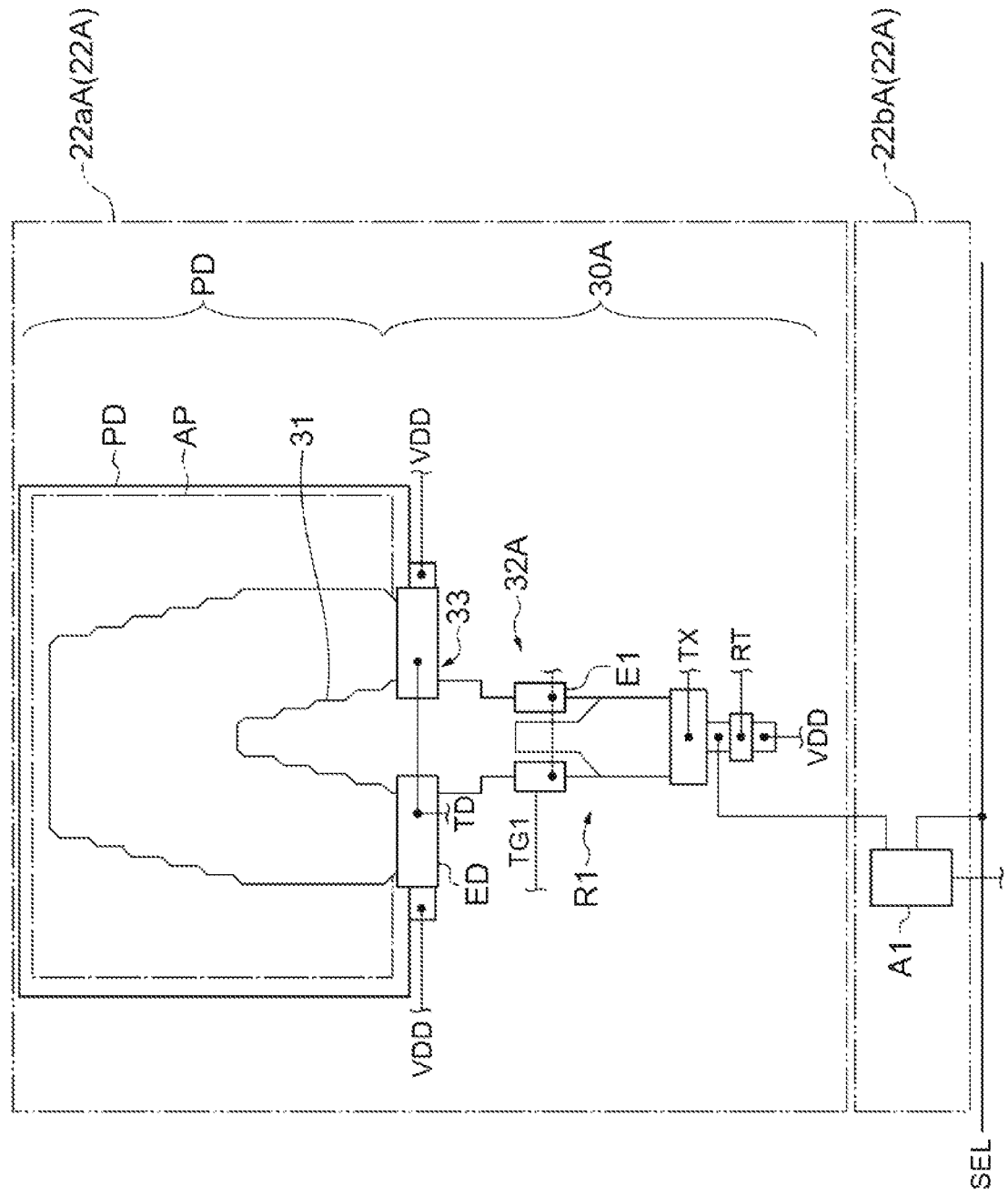
FIG. 17 is a diagram showing a configuration of a pixel shown in FIG. 16.

As shown in FIG. 17, the pixel 22A includes a photodetection unit 22aA and an amplifier unit 22bA. The photodetection unit 22aA includes the photoelectric conversion unit PD and an electric charge transfer unit 30A. The electric charge transfer unit 30A includes the electric charge collecting region 31, the drain 33, and one electric charge reading region R1. Then, the amplifier unit 22bA includes one buffer amplifier A1.

Figure 18:
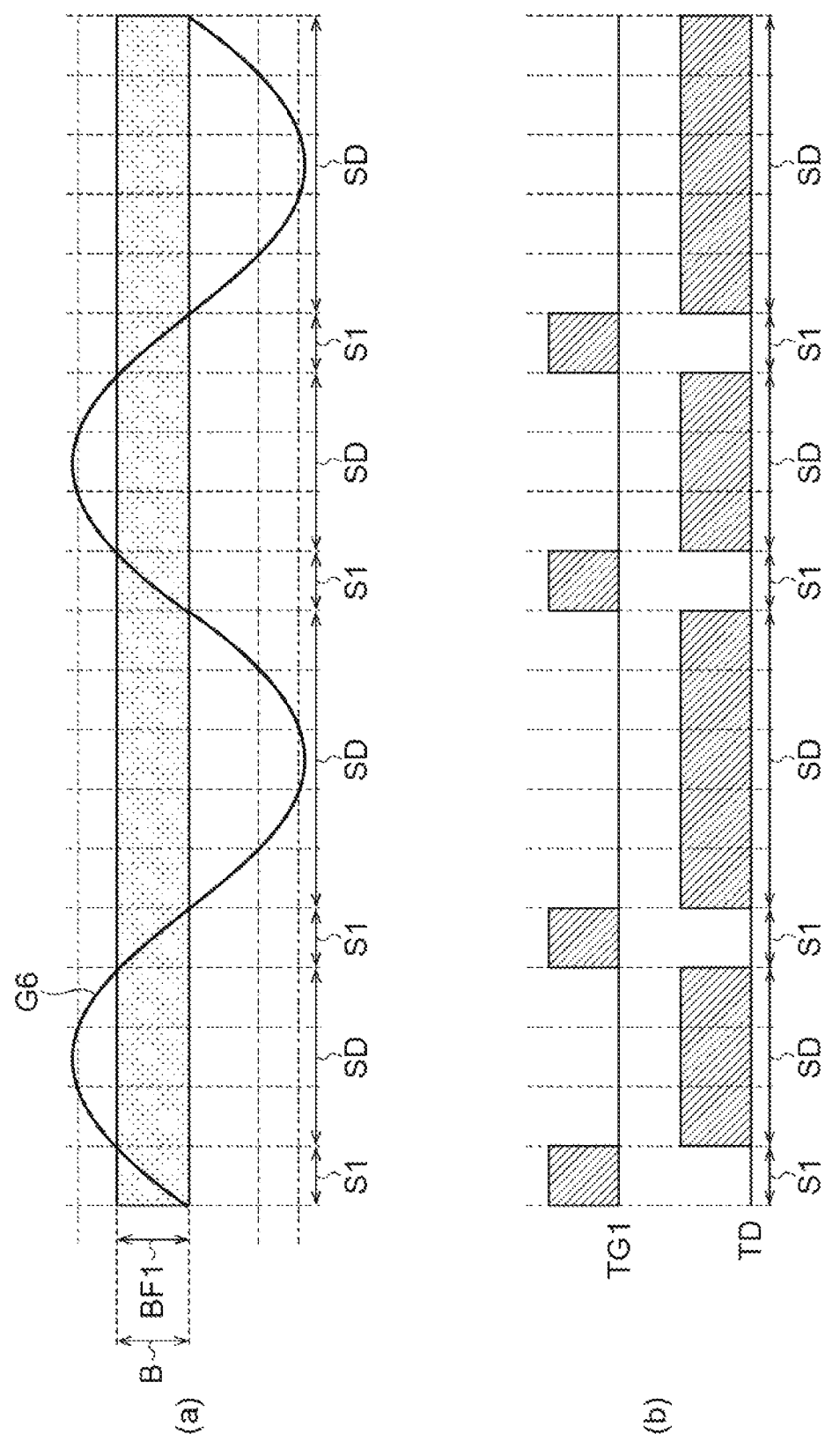
FIG. 18(a) is a graph showing a focal position and a focal range of a varifocal lens and FIG. 18(b) is a timing chart showing an operation of the pixel shown in FIGS. 16 and 17.

As shown in FIG. 18(a), in the seventh modified example, one focal range BF1 is set in the imaging range B. That is, the imaging range B matches the focal range BF1. Then, when the position of the focal point of the varifocal lens 10 is in the focal range BF1, the gate control circuit 26 outputs the control signal TG1 (HIGH) and outputs the control signal TD (LOW). When the position of the focal point of the varifocal lens 10 is in the non-imaging range C, the gate control circuit 26 outputs the control signal TG1 (LOW) and outputs the control signal TD (HIGH). According to this control, the timing of accumulating the electric charge in the electric charge transfer unit 30A occurs twice for one cycle of the position of the focal position.

The imaging device 1A including the pixel 22A of the seventh modified example can also have the same effect as that of the imaging device 1 of the embodiment.

<Eighth Modified Example>

As shown in FIG. 8(b), in the imaging device 1 of the embodiment, the exposure period S1 corresponding to the focal range BF1 was immediately provided after the exposure period S2 corresponding to the focal range BF2 was provided. That is, the focal ranges BF1, BF2, BF3, and BF4 of the imaging device 1 of the embodiment were adjacent to each other. The setting of the focal ranges BF1, BF2, BF3, and BF4 is not limited to being adjacent to each other.

Figure 19:
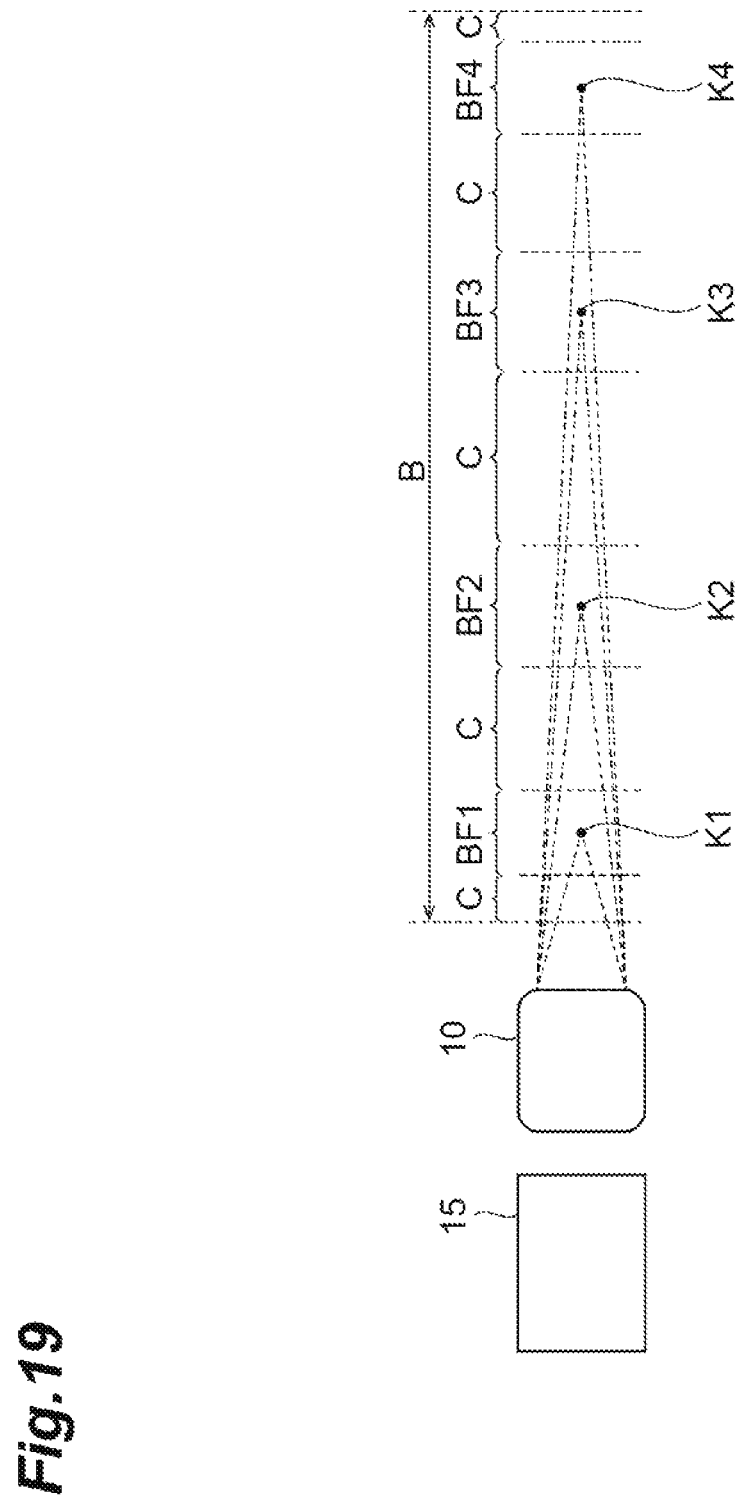
FIG. 19 is a diagram showing an imaging range of an imaging device of the eighth modified example.

As shown in FIG. 19, the varifocal lens 10 can set the focal point in the imaging range B. In the eighth modified example, the focal range BF1 is set to a position closest to the varifocal lens 10. The focal range BF4 is set to a position farthest from the varifocal lens 10. Here, the non-imaging range C is set between the focal range BF1 and the focal range BF2. Similarly, the non-imaging range C is also set between the focal range BF3 and the focal range BF4 and the non-imaging range C is also set between the focal range BF2 and the focal range BF3. That is, in the operation of the eighth modified example, each region is set in order of the non-imaging range C, the focal range BF1, the non-imaging range C, the focal range BF2, the non-imaging range C, the focal range BF3, the non-imaging range C, the focal range BF4, and the non-imaging range C in a direction moving away from the varifocal lens 10.

According to such a setting, the electric charge is transferred to the electric charge reading region R1 when the focal position exists in the focal range BF1 (see the point K1 of FIG. 19). The operation of transferring the electric charge to the electric charge reading region is also referred to as the exposure operation. Similarly, when the focal position exists in the focal ranges BF2, BF3, and BF4 (see the points K2, K3, and K4 of FIG. 19), the electric charge is transferred to each of the electric charge reading regions R2, R3, and R4.

The continuation time (S1 to S4) of the operation of transferring the electric charge to the electric charge reading region is, for example, about 200 nanoseconds to 2000 nanoseconds. In other words, the continuation time of the operation of transferring the electric charge to the electric charge reading region is an exposure time. When the focal point exists in the non-imaging range C, the continuation time (SD) of the operation of discharging the electric charge to the electric charge discharging region is also the same. Further, the time interval ($T_{T4G}$) until the exposure operation corresponding to the focal range BF1 is performed again after the exposure operation corresponding to the focal range BF1 is performed is about 14.5 microseconds as an example. Further, the frame period ($T_{frame}$) is about 10 milliseconds.

The operation of the eighth modified example will be described with reference to the timing chart. As shown in FIG. 20(a), the imaging range B of the eighth modified example includes the focal range BF1 set in the vicinity of the closest point Pc, the focal range BF2 including the middle point Pm, the focal range BF4 set in the vicinity of the farthest point Pd, and the focal range BF3 set from the focal range BF2 to the focal range BF4. The non-imaging range C is set between the respective focal ranges BF1, BF2, BF3, and BF4.

As shown in FIG. 20(b), the gate control circuit 26 first transfers the electric charge to the electric charge reading region R2 during the period S2 in which the focal point exists in the focal range BF2. Next, the gate control circuit 26 discharges the electric charge to the drain DR during the period SD in which the focal point exists in the non-imaging range C from the focal range BF2 to the focal range BF1. Next, the gate control circuit 26 transfers the electric charge to the electric charge reading region R1 during the period S1 in which the focal point exists in the focal range BF1. Then, the gate control circuit 26 discharges the electric charge to the drain DR again during the period SD in which the focal point exists in the non-imaging range C from the focal range BF1 to the focal range BF2. As described above, the gate control circuit 26 alternately performs an operation of transferring the electric charge to the electric charge reading regions R1, R2, R3, and R4 and an operation of discharging the electric charge to the drain DR.

That is, the gate control circuit 26 of the eighth modified example performs an operation of outputting the transfer control signal, performs an operation of outputting the discharge control signal after the operation of outputting the transfer control signal, performs an operation of outputting the additional transfer control signal after the operation of outputting the discharge control signal, and performs an operation of outputting the discharge control signal again after the operation of outputting the additional transfer control signal. According to this configuration, it is possible to discretely set each focal range to a narrow range. As a result, since the focal range in which the light from different focal points is averaged is narrowed, it is possible to increase the sharpness of the image of each focal range.

Further, according to such an operation, for example, there is no operation in which the electric charge to be transferred to the electric charge reading region R2 is transferred to the electric charge reading region R1 at a timing immediately before and after the transfer operation to the electric charge reading region R2 is switched to the transfer operation to the electric charge reading region R1. That is, according to such an operation, it is possible to reliably separate the electric charge to be transferred to the electric charge reading region R1 from the electric charge to be transferred to the electric charge reading region R2.

REFERENCE SIGNS LIST

1: imaging device, 10: varifocal lens, 11: lens unit, 12: lens driving unit, 15: imaging sensor, 20: pixel circuit unit, 21: pixel array. 25: peripheral circuit, 26: gate control circuit (control means), 27: reading circuit (signal reading means), 50: pixel control unit, 60: image processing unit, B: imaging range, BF1, BF2, BF3, BF4: focal range, DR: drain (electric charge discharging region), E1, E2, E3, E4: transfer control electrode, ED: discharge control electrode, P: focal point, Pc: closest point, PD: photoelectric conversion unit, Pd: farthest point, Pm: middle point, R1, R1s, R2, R3, R4: electric charge reading region.

The invention claimed is:

1. An imaging device comprising:
a varifocal lens in which a position of a focal point periodically changes between a farthest point and a closest point during a frame period; and
a pixel circuit unit which is disposed to overlap an optical axis of the varifocal lens and is configured to receive light having passed through the varifocal lens and output a signal corresponding to the light,
wherein the pixel circuit unit includes a photoelectric conversion unit which converts the light into an electric charge, an electric charge reading region which is provided adjacent to the photoelectric conversion unit, a transfer control electrode which is provided between the photoelectric conversion unit and the electric charge reading region and receives a transfer control signal for transferring an electric charge between the photoelectric conversion unit and the electric charge reading region, an electric charge discharging region which is provided to be adjacent to the photoelectric conversion unit and to be separated from the electric charge reading region and discharges the electric charge not provided for reading a signal corresponding to the light, a discharge control electrode which is provided between the photoelectric conversion unit and the electric charge discharging region and receives a discharge control signal for transferring an electric charge between the photoelectric conversion unit and the electric charge discharging region, a control means for applying the transfer control signal to the transfer control electrode and applying the discharge control signal to the discharge control electrode to correspond to the position of the focal point of the varifocal lens, and a signal reading means for outputting the signal corresponding to the amount of the electric charge transferred to the electric charge reading region, and wherein the control means repeats an operation of outputting the transfer control signal when the position of the focal point is located in a focal range set in an imaging range and an operation of outputting the discharge control signal when the position of the focal point is located in a non-imaging range not overlapping the imaging range, and operation of outputting the additional transfer control signal when the position of the focal point is located in an additional focal range set in the imaging range and not overlapping the focal range during the frame period, and wherein the signal reading means outputs the signal corresponding to the amount of the electric charge transferred to the electric charge reading region after the frame period elapses and further outputs the signal corresponding to the electric charge amount which is the amount of the electric charge transferred to the additional electric charge reading region.

2. The imaging device according to claim 1,
wherein the control means generates the transfer control signal and the additional transfer control signal so that a length of a period of permitting the transfer of the electric charge from the photoelectric conversion unit to the electric charge reading region and a length of a period of permitting the transfer of the electric charge from the photoelectric conversion unit to the one or more additional electric charge reading regions are the same as each other.

3. The imaging device according to claim 1,
wherein the control means generates the transfer control signal and the additional transfer control signal so that a change amount of the position of the focal point during a period of permitting the transfer of the electric charge from the photoelectric conversion unit to the electric charge reading region and a change amount of the position of the focal point during a period of permitting the transfer of the electric charge from the photoelectric conversion unit to the one or more additional electric charge reading regions are the same as each other.

4. The imaging device according to claim 1,
wherein the control means sets a plurality of subframe periods included in the frame period, and
wherein the control means sets the imaging range for each of the plurality of subframe periods.

5. The imaging device according to claim 4,
wherein the imaging range set for each of the plurality of subframe periods does not overlap each other.

6. The imaging device according to claim 4,
wherein the imaging range set for each of the plurality of subframe periods overlaps each other.

7. The imaging device according to claim 1,
wherein the control means performs an operation of outputting the transfer control signal twice for one cycle of the change of the position of the focal point.

8. The imaging device according to claim 1,
wherein the control means performs an operation of outputting the transfer control signal once for one cycle of the change of the position of the focal point.

9. The imaging device according to claim 1,
wherein the varifocal lens includes a lens unit through which the light is transmitted and a lens driving unit which periodically changes the position of the focal point of the lens unit by providing a lens driving signal to the lens unit, and
wherein the imaging device further comprises a pixel control unit which receives the lens driving signal from the lens driving unit and provides a control signal for the pixel circuit unit to the pixel circuit unit on the basis of the lens driving signal.

10. The imaging device according to claim 1,
wherein the electric charge reading region has a two-stage transfer structure, and
wherein the two-stage transfer structure includes an electric charge accumulation portion which receives the electric charge from the photoelectric conversion unit, a floating diffusion portion which receives the electric charge from the electric charge accumulation portion and is connected to the signal reading means, a reset drain which receives the electric charge from the floating diffusion portion, a transfer gate electrode which controls the transfer of the electric charge from the electric charge accumulation portion to the floating diffusion portion, and a reset gate electrode which controls the transfer of the electric charge from the floating diffusion portion to the reset drain.

11. The imaging device according to claim 1,
wherein the electric charge reading region has a one-stage transfer structure, and
wherein the one-stage transfer structure includes a floating diffusion portion which receives the electric charge from the photoelectric conversion unit, a reset drain which receives the electric charge from the floating diffusion portion, and a reset gate electrode which controls the transfer of the electric charge from the floating diffusion portion to the reset drain.

12. The imaging device according to claim 1,
wherein the control means performs an operation of outputting the transfer control signal, performs an operation of outputting the discharge control signal after the operation of outputting the transfer control signal, performs an operation of outputting the additional transfer control signal after the operation of outputting the discharge control signal, and performs an operation of outputting the discharge control signal again after the operation of outputting the additional transfer control signal.

* * * * *